(12) United States Patent
Qiang et al.

(10) Patent No.: US 12,550,354 B2
(45) Date of Patent: Feb. 10, 2026

(54) THIN FILM TRANSISTOR AND MANUFACTURING METHOD THEREFOR, AND DISPLAY APPARATUS

(71) Applicant: BOE TECHNOLOGY GROUP CO., LTD., Beijing (CN)

(72) Inventors: Zhaohui Qiang, Beijing (CN); Chao Li, Beijing (CN); Huiqin Zhang, Beijing (CN); Li Qiang, Beijing (CN); Feng Guan, Beijing (CN); Zhiwei Liang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 944 days.

(21) Appl. No.: 17/776,923

(22) PCT Filed: Jun. 15, 2021

(86) PCT No.: PCT/CN2021/100143
§ 371 (c)(1),
(2) Date: May 13, 2022

(87) PCT Pub. No.: WO2022/012251
PCT Pub. Date: Jan. 20, 2022

(65) Prior Publication Data
US 2022/0416091 A1    Dec. 29, 2022

(30) Foreign Application Priority Data
Jul. 17, 2020 (CN) .......................... 202010693348.9

(51) Int. Cl.
*H10D 30/01* (2025.01)
*H10D 30/67* (2025.01)
*H10K 59/12* (2023.01)

(52) U.S. Cl.
CPC ....... *H10D 30/0314* (2025.01); *H10D 30/031* (2025.01); *H10D 30/6757* (2025.01); *H10K 59/12* (2023.02)

(58) Field of Classification Search
CPC ............. H10D 30/0314; H10D 30/031; H10D 30/6757; H10D 30/6715; H10D 30/021;
(Continued)

(56) References Cited

U.S. PATENT DOCUMENTS

| | | | |
|---|---|---|---|
| 5,429,962 | A | 7/1995 | Yang |
| 7,907,226 | B2 | 3/2011 | Yang et al. |

(Continued)

FOREIGN PATENT DOCUMENTS

| | | |
|---|---|---|
| CN | 101644865 A | 2/2010 |
| CN | 103151388 A | 6/2013 |
| CN | 107170807 A | 9/2017 |
| CN | 107482066 A | 12/2017 |
| CN | 108538725 A | 9/2018 |
| CN | 111129032 A | 5/2020 |
| JP | 2006-229026 A | 8/2006 |
| WO | 2018/205794 A1 | 11/2018 |

OTHER PUBLICATIONS

Office Action for the Chinese Patent Application No. 202010693348.9 issued by the Chinese Patent Office on Aug. 3, 2022.

*Primary Examiner* — Ratisha Mehta
(74) *Attorney, Agent, or Firm* — XSENSUS LLP

(57) ABSTRACT

A thin film transistor includes an active layer, first and second electrodes, and a third doped pattern. The active layer has a channel region, and a first electrode region and a second electrode region, the first electrode region has a first ion doping concentration, and the second electrode region has a second ion doping concentration. The first electrode and the second electrode are disposed on a side of the active layer in the thickness direction. The first electrode is coupled to the first electrode region, and the second electrode is coupled to the second electrode region. The third doped pattern is disposed between the first electrode and the first electrode region, and in direct contact with the first
(Continued)

electrode and the first electrode region. The third doped pattern has a third ion doping concentration, and the third ion doping concentration is different from the first ion doping concentration.

20 Claims, 15 Drawing Sheets

(58) Field of Classification Search
CPC .......... H10D 30/0321; H10D 30/6717; H10D 30/6731; H10D 30/6745; H10D 62/10; H10D 62/124; H10D 86/40; H10D 86/60; H10D 30/6704; H10K 59/12
See application file for complete search history.

(56) References Cited

U.S. PATENT DOCUMENTS

| | | | |
|---|---|---|---|
| 2001/0002704 A1 | 6/2001 | Yamaguchi et al. | |
| 2010/0032674 A1 | 2/2010 | Noda et al. | |
| 2015/0206905 A1* | 7/2015 | Wang ................... | H01L 21/324 257/66 |
| 2019/0088788 A1 | 3/2019 | Ban et al. | |
| 2021/0233941 A1* | 7/2021 | Chen ..................... | H10D 86/60 |
| 2021/0408063 A1 | 12/2021 | Luo | |

* cited by examiner

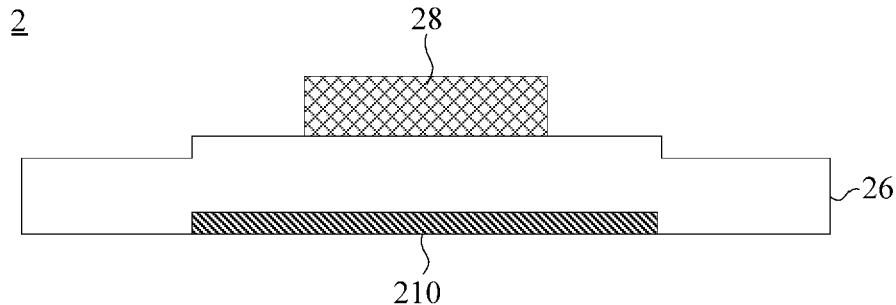
FIG. 9B
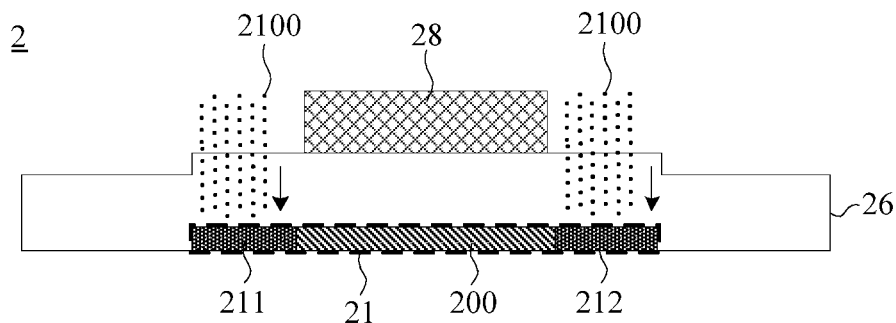
FIG. 9C
Form a first via hole in the gate insulating layer; an orthogonal projection of the first via hole on the active layer being located within a range of the first electrode region — S20
Form a doped film on sides, away from the active layer, of the gate insulating layer and the gate, pattern the doped film, and form the third doped pattern in the first via hole — S21
FIG. 10A

THIN FILM TRANSISTOR AND MANUFACTURING METHOD THEREFOR, AND DISPLAY APPARATUS

CROSS-REFERENCE TO RELATED APPLICATIONS

The present disclosure is a national phase entry under 35 USC 371 of International Patent Application No. PCT/CN2021/100143, filed on Jun. 15, 2021, which claims priority to Chinese Patent Application No. 202010693348.9, filed on Jul. 17, 2020, which are incorporated herein by reference in their entirety.

TECHNICAL FIELD

The present disclosure relates to the field of display technologies, and in particular, to a thin film transistor and a manufacturing method therefor, and a display apparatus.

BACKGROUND

In a driving circuit of a display panel, the most used devices are thin film transistors (TFTs), and the thin film transistors are field effect transistors. In the driving circuit, the function of the TFT is a three-terminal switch, the three terminals are, for example, a gate, a source and a drain. When the gate is turned on, the signal can be transmitted from the source to the drain.

SUMMARY

In one aspect, a thin film transistor is provided. The thin film transistor includes an active layer, a first electrode, a second electrode and a third doped pattern. A material of the active layer is polysilicon, and the active layer has a channel region, and a first electrode region and a second electrode region that are located on two opposite sides of the channel region in a direction perpendicular to a thickness direction of the active layer. The first electrode region and the second electrode region are ion doped regions, the first electrode region has a first ion doping concentration, and the second electrode region has a second ion doping concentration. The first electrode and the second electrode are disposed on a side of the active layer in the thickness direction of the active layer, arranged in a same layer and made of a same material. The first electrode is coupled to the first electrode region, and the second electrode is coupled to the second electrode region. The third doped pattern is disposed between the first electrode and the first electrode region, and is in direct contact with the first electrode and the first electrode region. The third doped pattern has a third ion doping concentration, and the third ion doping concentration is different from the first ion doping concentration.

In some embodiments, the thin film transistor further includes a fourth doped pattern. The fourth doped pattern is disposed between the second electrode and the second electrode region, and is in direct contact with the second electrode and the second electrode region. The fourth doped pattern has a fourth ion doping concentration, and the fourth ion doping concentration is different from the second ion doping concentration.

In some embodiments, the thin film transistor further includes a gate insulating layer and a gate that are stacked in the thickness direction of the active layer. The gate insulating layer and the gate are disposed between the active layer and both the first electrode and the second electrode. The gate insulating layer is located between the active layer and the gate. The gate insulating layer is provided with a first via hole therein, and an orthogonal projection of the first via hole on the active layer is located within a range of an overlapping region between the first electrode region and an orthogonal projection of the first electrode on the active layer.

The third doped pattern is located in the first via hole.

In some embodiments, the thin film transistor further includes the fourth doped pattern. The gate insulating layer is further provided with a second via hole therein, and an orthogonal projection of the second via hole on the active layer is located within a range of an overlapping region between the second electrode region and an orthogonal projection of second electrode on the active layer.

The fourth doped pattern is located in the second via hole.

In some embodiments, the fourth doped pattern has a fourth ion doping concentration, and the fourth ion doping concentration is different from the second ion doping concentration. The first ion doping concentration is approximately equal to the second ion doping concentration; the third ion doping concentration is approximately equal to the fourth ion doping concentration; and the first ion doping concentration is greater than the third ion doping concentration.

In some embodiments, a height of the third doped pattern is less than or equal to a depth of the first via hole, and a height of the fourth doped pattern is less than or equal to a depth of the second via hole.

In some embodiments, the thin film transistor further includes an interlayer insulating layer. The interlayer insulating layer is disposed on a side of the gate away from the active layer, and the interlayer insulating layer is provided with a third via hole and a fourth via hole therein. The third via hole is communicated with the first via hole, and the fourth via hole is communicated with the second via hole. An orthogonal projection of the third via hole on the active layer is located within the range of the overlapping region between the first electrode region and the orthogonal projection of the first electrode on the active layer; an orthogonal projection of the fourth via hole on the active layer and an orthogonal projection of the second via hole on the active layer are located within a range of an overlapping region between the second electrode region and the orthogonal projection of the second electrode on the active layer.

In some embodiments, a diameter of the third via hole is greater than a diameter of the first via hole, and a diameter of the fourth via hole is greater than a diameter of the second via hole.

In some embodiments, the third doped pattern is further located in the third via hole, and the fourth doped pattern is further located in the fourth via hole.

In some embodiments, a thickness of the third doped pattern is approximately equal to a thickness of the fourth doped pattern.

In some embodiments, a material of the third doped pattern and the fourth doped pattern is a semiconductor material including N+ ions.

In another aspect, a display apparatus is provided. The display apparatus includes the thin film transistor as described in any one of the above embodiments.

In yet another aspect, a manufacturing method for a thin film transistor is provided. The method includes:

forming an active layer; a material of the active layer being polysilicon, the active layer having a channel region, and a first electrode region and a second electrode region that are located on two opposite sides of the channel region in a direction perpendicular to a thickness direction of the active layer, the first electrode region and the second electrode region being ion doped regions, the first electrode region having a first ion doping concentration, and the second electrode region having a second ion doping concentration;

forming a third doped pattern on a surface of the active layer, the third doped pattern having a third ion doping concentration, and the third ion doping concentration being different from the first ion doping concentration;

forming a first electrode on a surface of the third doped pattern away from the active layer, and forming a second electrode on the active layer; the first electrode and the second electrode being arranged in a same layer and made of a same material, the first electrode being coupled to the first electrode region through the third doped pattern, and the second electrode being coupled to the second electrode region.

In some embodiments, the method further includes: forming a fourth doped pattern on the surface of the active layer while the third doped pattern is formed on the active layer. The fourth doped pattern is coupled to the second electrode region, the fourth doped pattern has a fourth ion doping concentration, and the fourth ion doping concentration is different from the second ion doping concentration.

Forming the second electrode on the active layer further includes: forming the second electrode on a surface of the fourth doped pattern away from the active layer. The fourth doped pattern is coupled to the second electrode.

In some embodiments, forming the active layer includes:
forming a polysilicon film to form a semiconductor pattern through a patterning process;
forming a gate insulating layer on a side of the semiconductor pattern;
forming a gate on a side of the gate insulating layer away from the semiconductor pattern; and
performing ion doping on portions of the semiconductor pattern where the first electrode region and the second electrode region are to be formed to form the active layer.

In some embodiments, forming the third doped pattern on the surface of the active layer includes:
forming a first via hole in the gate insulating layer; an orthogonal projection of the first via hole on the active layer being located within a range of the first electrode region; and
forming a doped film on sides, away from the active layer, of the gate insulating layer and the gate; and patterning the doped film to form the third doping patter in the first via hole.

In some embodiments, the method further includes: forming a second via hole while the first via hole is formed on the gate insulating layer; an orthogonal projection of the second via hole on the active layer being located within a range of the second electrode region.

The doped film is formed on the sides, away from the active layer, of the gate insulating layer and the gate, and the doped film is patterned, so as to form the fourth doped pattern in the second via hole while the third doped pattern is formed in the first via hole.

In some embodiments, forming the third doped pattern on the surface of the active layer includes:
forming an interlayer insulating layer on sides, away from the active layer, of the gate insulating layer and the gate;
forming a third via hole and a first via hole communicated with each other in the interlayer insulating layer and the gate insulating layer; the third via hole being located in the interlayer insulating layer, and the first via hole being located in the gate insulating layer, and an orthogonal projection of the third via hole on the active layer and an orthogonal projection of the first via hole on the active layer being located within a range of the first electrode region; and
forming a doped film on a side of the interlayer insulating layer away from the active layer, and patterning the doped film to form a third doped film in the third via hole and the first via hole.

In some embodiments, the method further includes: while the third via hole and the first via hole communicated with each other are formed on the interlayer insulating layer and the gate insulating layer, forming a fourth via hole and a second via hole communicated with each other in the interlayer insulating layer and the gate insulating layer. The fourth via hole is located in the interlayer insulating layer, the second via hole is located in the gate insulating layer, and an orthogonal projection of the fourth via hole on the active layer and the orthogonal projection of the second via hole on the active layer are located within the range of the second electrode region.

The doped film is formed on the side of the interlayer insulating layer away from the active layer, and the doped film is patterned, so as to form the fourth doped pattern in both the fourth via hole and the second via hole while the third doped pattern is formed in the third via hole and first via hole.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals to which the embodiments of the present disclosure relate.

FIGS. 9B and 9C are diagrams of a process of manufacturing an active layer, in accordance with some embodiments of the present disclosure;

FIG. 10A is a flow diagram of a process of manufacturing a third doped pattern, in accordance with some embodiments of the present disclosure;

DETAILED DESCRIPTION

Figure 1A:
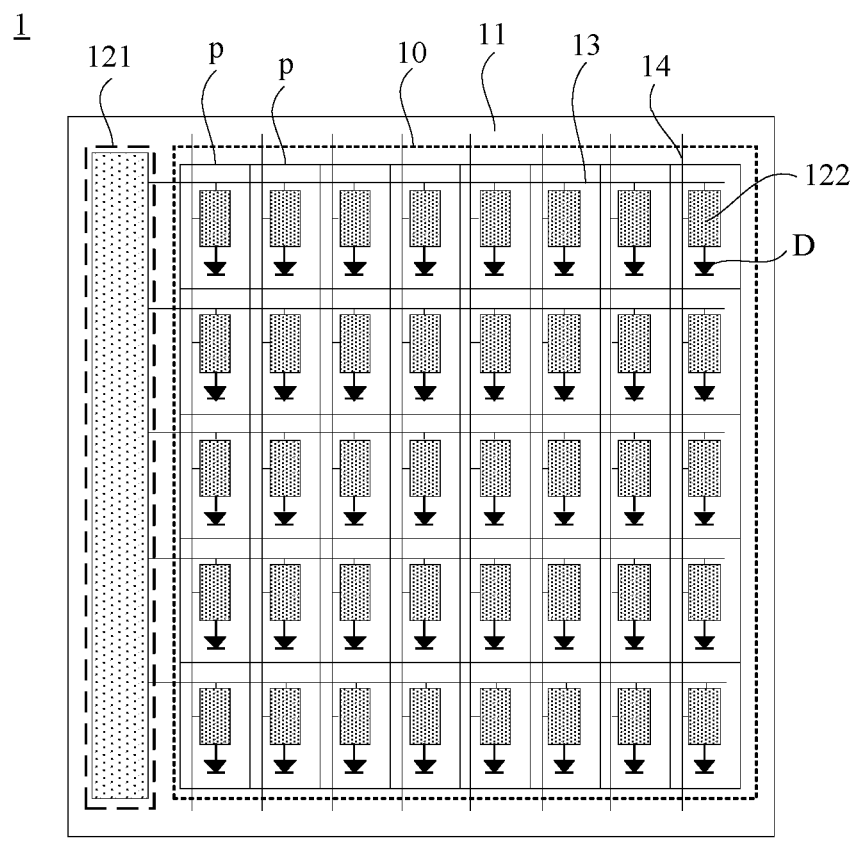
FIG. 1A is a structural diagram of a display apparatus, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive sense, i.e., "including, but not limited to". In the description, the terms such as "one embodiment", "some embodiments", "exemplary embodiments", "example", "specific example" or "some examples" is intended to indicate that specific features, structures, materials or characteristics related to the embodiment(s) or example(s) are included in at least one embodiment or example of the present disclosure. Schematic representation of the above term does not necessarily refer to the same embodiment(s) or examples(s). In addition, the specific features, structures, materials or characteristics may be included in any one or more embodiments or examples in any suitable manner.

Hereinafter, the terms "first" and "second" are only used for descriptive purposes, and are not to be construed as indicating or implying the relative importance or implicitly indicating the number of indicated technical features. Thus, a feature defined with the term such as "first" or "second" may explicitly or implicitly include one or more of the features. In the description of the embodiments of the present disclosure, the term "a plurality of/the plurality of" means two or more unless otherwise specified.

In the description of some embodiments, the terms "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact with each other. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if", depending on the context, is optionally construed as "when" or "in a case where" or "in response to determining" or "in response to detecting". Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

The use of "applicable to" or "configured to" herein means an open and inclusive expression, which does not exclude devices that are applicable to or configured to perform additional tasks or steps.

Additionally, the use of the phrase "based on" is meant to be open and inclusive, since a process, step, calculation or other action that is "based on" one or more of the stated conditions or values may, in practice, be based on additional conditions or value beyond those stated.

As used herein, the term such as "about" or "approximately" includes a stated value and an average value within an acceptable range of deviation of a particular value. The acceptable range of deviation is determined by a person of ordinary skill in the art, in consideration of measurement in question and errors associated with the measurement of a particular quantity (i.e., limitations of a measurement system).

As used herein, the phrase "same layer" refers to a layer structure formed by a film layer for forming a specific pattern through a same film forming process and then by a patterning process using a same mask. Depending on different specific patterns, a same patterning process may include multiple exposure, development and etching, and the specific patterns in the formed layer structure may be continuous or discontinuous, and these specific patterns may also be at different heights or have different thicknesses.

Exemplary embodiments are described herein with reference to sectional views and/or plan views as idealized exemplary drawings. In the accompanying drawings, thickness of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown as a rectangle generally has a curved feature. Therefore, the regions shown in the accompanying drawings are schematic in nature, and their shapes are not intended to show actual shapes of regions in a device, and are not intended to limit the scope of the exemplary embodiments.

Some embodiments of the present disclosure provide a display apparatus. The display apparatus may be, for example, any one of a liquid crystal display (LCD), an organic light-emitting diode (OLED) display apparatus, and a quantum dot light-emitting diode (QLED) display apparatus.

As shown in FIG. 1A, the display apparatus 1 has a display area 10 and a peripheral area 11 that at least partially surrounds the display area 10. The display area 10 is provided with sub-pixels p of a plurality of colors therein. For example, the plurality of colors are three primary colors. The three primary colors are, for example, red, green, and blue.

Driving circuits are provided in the display apparatus 1 therein, and the driving circuit includes, for example, a plurality of thin film transistors coupled with one another and some other devices. The driving circuits include, for example, pixel driving circuits and a GOA (gate driver on array) circuit. The pixel driving circuit is disposed in a sub-pixel p. The some other devices are, for example, capacitors. The capacitors are, for example, storage capacitors.

Referring to FIG. 1A, in an example in which the display apparatus 1 is the OLED display apparatus, the pixel driving circuits 122 are each disposed in a sub-pixel p, and the GOA circuit 121 is disposed in the peripheral area 11. A plurality of gate lines 13 and data lines 14 are provided in the display apparatus 1 therein, pixel driving circuits 122 in a same row of sub-pixels p are electrically connected to a same gate line 13, and pixel driving circuits 122 in a same column of sub-pixels p are electrically connected to a same data line 14. An end of a gate line 13 is coupled to an output end of the GOA circuit 121, so that the signal provided by the GOA circuit 121 may be transmitted to the pixel driving circuits 122 in the same row through the gate line 13, and the pixel driving circuits 122 in the same row are turned on; and thus, all the data lines 14 start writing data signals into corresponding pixel driving signals 122, thereby driving light-emitting devices D coupled to the pixel driving circuits 122 to emit light.

For example, the pixel driving circuit 122 is a driving circuit with a 2T1C structure or a 7T1C structure. The GOA circuit 121 is, for example, a circuit with a 3T1C structure or an 8T2C structure. The GOA circuit 121 may be a gate driving circuit (a Gate GOA circuit) or a light-emitting control circuit (an EM GOA circuit). T represents a thin film transistor, and C represents a capacitor. For example, 2T1C is referred to as the pixel driving circuit 122 including two thin film transistors and one capacitor.

Figure 1B:
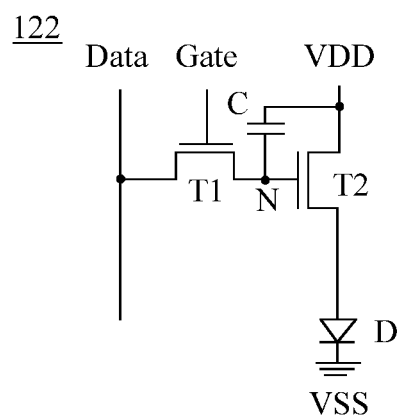
FIG. 1B is an equivalent circuit diagram of a pixel circuit, in accordance with some embodiments of the present disclosure.

For example, referring to FIG. 1B, the pixel driving circuit 122 with a 2T1C structure includes a first transistor T1, a second transistor T2 and a capacitor C. The second transistor T2 is a driving transistor. A gate of the first transistor T1 is electrically connected to a gate driving signal terminal Gate, a first electrode of the first transistor T1 is electrically connected to a data signal terminal Data, and a second electrode of the first transistor T1 is electrically connected to a node N. A gate of the second transistor T2 is electrically connected to the node N, a first electrode of the second transistor T2 is electrically connected to a power voltage signal terminal VDD, and a second electrode of the second transistor T2 is electrically connected to an anode of a light-emitting device D. A terminal of the capacitor C is coupled to the node N, and another terminal of the capacitor C is coupled to the power voltage signal terminal VDD. A cathode of the light-emitting device D is electrically connected to a cathode signal terminal VSS.

The Gate GOA circuit may provide a gate driving signal to the gate line 13, the gate line 13 may transmit the gate driving signal to the gate driving signal terminal Gate, and the data line 14 may provide a data signal to the data signal terminal Data.

Numbers of thin film transistors and capacitors in the pixel driving circuit 122 and the GOA circuit 121 may be selected according to actual needs of the driving circuits. Therefore, the numbers of thin film transistors and capacitors in the pixel driving circuit 122 and the GOA circuit 121 are not limited in the present disclosure, and the pixel driving circuit 122 and the GOA circuit 121 listed above are used to illustrate that these driving circuits need to be constituted by thin film transistors.

Based on the above, referring to FIGS. 2A to 2D, some embodiments of the present disclosure provide a thin film transistor 2 including an active layer 21, a first electrode 24, a second electrode 25, and a third doped pattern 22.

A material of the active layer 21 is, for example, poly-silicon (p-si).

The active layer 21 has a channel region 200, and a first electrode region 211 and a second electrode region 212 that are located on two opposite sides of the channel region 200 in a direction perpendicular to a thickness direction of the active layer 21. The first electrode region 211 and the second electrode region 212 are ion doped regions, the first electrode region 211 has a first ion doping concentration, and the second electrode region 212 has a second ion doping concentration.

The first ion doping concentration of the first electrode region 211 and the second ion doping concentration of the second electrode region 212 may be the same or different.

The first electrode region 211 is, for example, a source region, and the second electrode region 212 is, for example, a drain region, and vice versa.

Figure 2A:
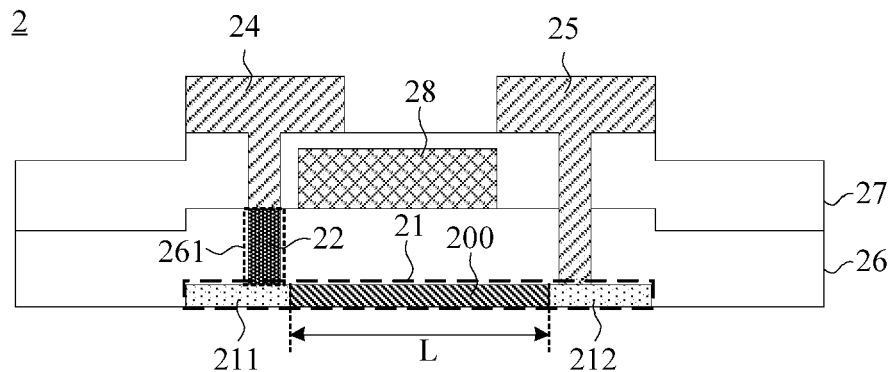
FIGS. 2A to 2D are structural diagrams of thin film transistors, in accordance with some embodiments of the present disclosure.
Figure 2B:
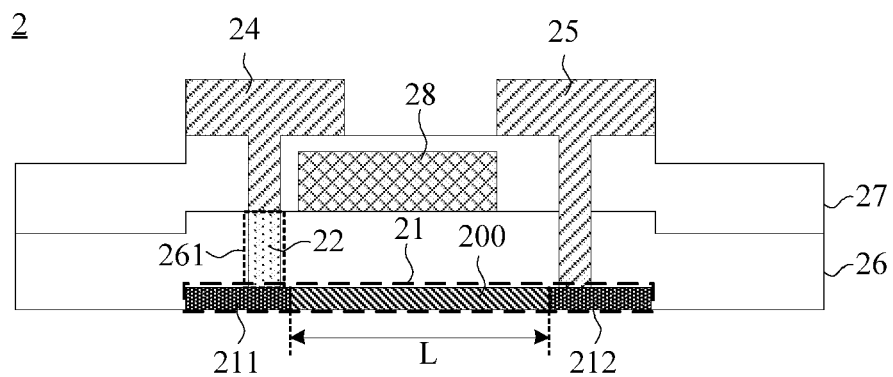
Figure 2C:
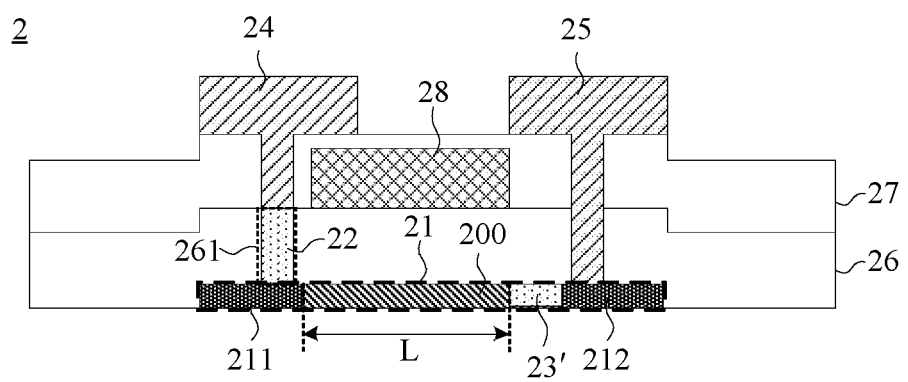

For example, referring to FIGS. 2A to 2C, the first ion doping concentration and the second ion doping concentration are the same.

Figure 2D:
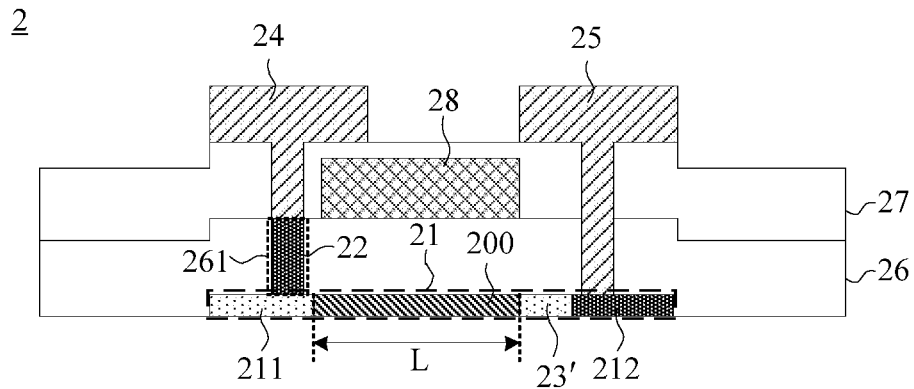

For another example, referring to FIG. 2D, the first ion doping concentration and the second ion doping concentration are different.

The first electrode 24 and the second electrode 25 are disposed on a side of the active layer 21 in the thickness direction of the active layer 21, and are arranged in a same layer and made of a same material. The first electrode 24 is coupled to the first electrode region 211, and the second electrode 25 is coupled to the second electrode region 212.

The first electrode 24 is, for example, a source, and the second electrode 25 is, for example, a drain. In a case where the first electrode 24 is a source, the first electrode region 211 is a source region; in a case where the second electrode 25 is a drain, the second electrode region 212 is a drain region; vice versa.

The third doped pattern 22 is disposed between the first electrode 24 and the first electrode region 211, and is in direct contact with the first electrode 24 and the first electrode region 211. The third doped pattern 22 has a third ion doping concentration, and the third ion doping concentration is different from the first ion doping concentration.

The third doped pattern 22 is disposed in the thickness direction of the active layer 21, is in direct contact with the first electrode 24 to form an ohmic contact, and is used to form a lightly doped drain (LDD) region or a highly doped drain (HDD) region.

An ion doping concentration of the HDD region is greater than an ion doping concentration of the LDD region. The LDD region is used to moderate a strong electric field of the drain of the thin film transistor 2, and may be equivalent to a resistance for reducing a magnitude of the light leakage current (current of the thin film transistor 2 in an off state). The LDD region may be further used to form an ohmic contact between the first electrode 24 and the second electrode 25, and has a coupling function. The HDD region may also be used to form an ohmic contact between the first electrode 24 and the second electrode 25, and has a coupling function.

It will be understood by those skilled in the art that, the LDD region achieves the purpose of reducing the leakage current of the thin film transistor 2 by reducing the drain voltage Vd of the thin film transistor 2. Therefore, when an area of the LDD region is larger, the effect of reducing the drain voltage Vd is more obvious, and the magnitude of the reduction of the leakage current is larger. Meanwhile, when the drain voltage Vd decreases, a threshold voltage of the thin film transistor 2 may increase.

Referring to FIGS. 2A to 2D, the first electrode region 211 and the second electrode region 212 having a coupling function. The first electrode region 211 enables the first electrode 24 to be coupled to the active layer 21, and the second electrode region 212 enables the second electrode 25 to be coupled to the active layer 21. An ohmic contact is formed between the third doped pattern 22 and the first electrode 24, and the third doped pattern 22 also has a coupling function for coupling the first electrode 24 to the active layer 21. An end of the second electrode 25 proximate to the active layer 21 is in contact with the second electrode region 212, that is, the second electrode 25 is directly coupled to the second electrode region 212, in this case, an ohmic contact is formed between the second electrode 25 and the second electrode region 212.

Based on this, the first electrode region 211, the second electrode region 212 and the third doped pattern 22 further have the following functions influenced by the magnitude relationship between the first ion doping concentration, the second ion doping concentration and the third ion doping concentration.

For example, referring to FIG. 2A, the first ion doping concentration is equal to or approximately equal to the second ion doping concentration, and the first ion doping concentration is less than the third ion doping concentration. In this case, the first electrode region 211 and the second electrode region 212 are LDD regions for reducing the leakage current and the drain voltage Vd.

Referring to FIG. 2B, the first ion doping concentration is equal to or approximately equal to the second ion doping concentration, and the first ion doping concentration is greater than the third ion doping concentration. In this case, the third doped pattern 22 is an LDD region for reducing the leakage current and the drain voltage Vd.

Referring to FIGS. 2C and 2D, in a case where the second electrode region 212 is the HDD region due to the second ion doping concentration, the active layer 21 may further include a third doped region 23'. The third doped region 23' is located between the first electrode region 211 and the second electrode region 212, and is adjacent to the second electrode region 212. An ion doping concentration of the third doped region 23' is, for example, a fifth doping concentration, and the fifth doping concentration may enable the third doped region 23' to be an LDD region for reducing the leakage current and the drain voltage Vd.

Referring to FIG. 2C, the first ion doping concentration is equal to or approximately equal to the second ion doping concentration, the third ion doping concentration is equal to or approximately equal to the fifth doping concentration, and the first ion doping concentration is greater than the third ion doping concentration. In this case, the third doped pattern 22 and the third doped region 23' are LDD regions for reducing the leakage current and the drain voltage Vd.

Referring to FIG. 2D, the first ion doping concentration is equal to or approximately equal to the fifth doping concentration, the second ion doping concentration is equal to or approximately equal to the third ion doping concentration, and the first ion doping concentration is less than the second ion doping concentration. In this case, the first electrode region 211 and the third doped region 23' are LDD regions for reducing the leakage current and the drain voltage Vd.

Referring to FIGS. 2A to 2D, a portion of the active layer 21 that is located between the first electrode region 211 and the second electrode region 212 and does not belong to the third doped region 23' is the channel region 200 of the thin film transistor 2. A length of the channel region 200 is, for example, L.

In a case where a pixel density of the display apparatus 1 is high, a size of the thin film transistor 2 is relatively small, and the length of the channel region 200 also decreases as the size of the thin film transistor 2 decreases. However, when the length of the channel region 200 is reduced to a certain extent, for example, when it is reduced to less than 2 micrometers (μm), a short-channel effect of the thin film transistor 2 may become obvious. The short-channel effect refers to that the threshold voltage of the thin film transistor and the length of the channel region 200 are related to a very serious degree, for example, the short channel effect causes the threshold voltage of the thin film transistor 2 to decrease as the channel length decreases. Drain induced barrier lowering (DIBL) is a manifestation of the short-channel effect. In the DIBL effect, in a case where the length of the channel region is small, the threshold voltage of the thin film transistor 2 decreases with the increase of the drain voltage Vd. For the same thin film transistor 2, if the drain voltage is different, the threshold voltage will be different, and the smaller the threshold voltage is, the easier the thin film transistor 2 is turned on, so that it difficult for the display apparatus 1 to accurately control the thin film transistor 2 to be turned on. As a result, the probability that the thin film transistor 2 is turned on by mistake is high, and the leakage current of the thin film transistor 2 may increase after the threshold voltage is reduced. Therefore, due to the short-channel effect, it is difficult for the thin film transistor 2 to be turned on accurately at different drain voltages, and the leakage current is large, and the overall performance of the thin film transistor 2 is poor.

Figure 3A:
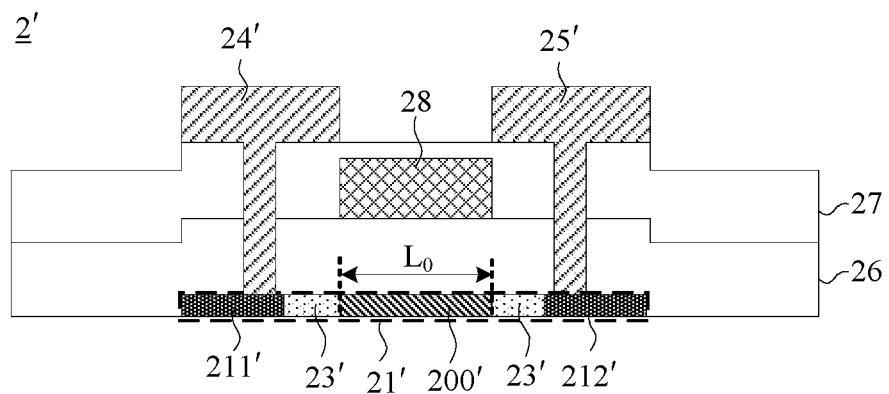
FIG. 3A is a structural diagram of a thin film transistor in the related art.

Referring to FIG. 3A, the thin film transistor 2' in the related art includes an active layer 21'. The active layer 21' includes a source region 211', a drain region 212', and two third doped regions 23' located between the source region 211' and the drain region 212'. The source region 211' and the drain region 212' are HDD regions, and the two third doped regions 23' are LDD regions. An ohmic contact is formed between the source electrode 24' and the source region 211', and an ohmic contact is formed between the drain electrode 25' and the drain region 212'. The two third doped regions 23' are equivalent to resistances, and are used for reducing magnitudes of the leakage current and a drain voltage Vd of the thin film transistor 2'. In the related art, two third doped regions 23' are provided for reducing the drain voltage Vd to improve the overall performance of the thin film transistor 2', however, since the two third doped regions 23' are located between the drain region 211' and the drain region 212', a length LO of the channel region 200' is small, so that the short-channel effect is still significant, and the overall performance of the thin film transistor 2' is poor.

Figure 3B:
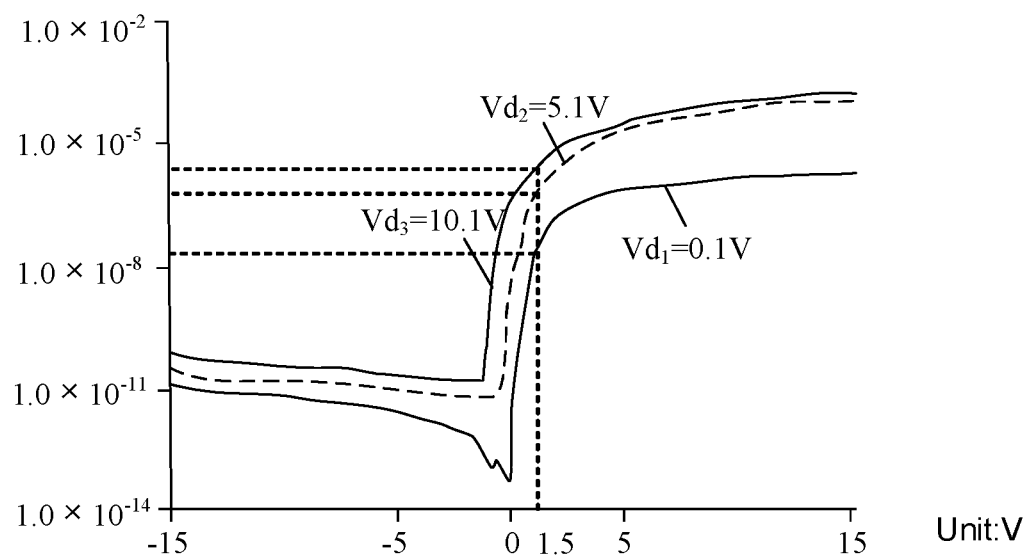
FIG. 3B is a diagram showing a relationship between a drain voltage, a gate voltage, and a leakage current of a thin film transistor in the related art.

For example, referring to FIG. 3B, the abscissa in the figure is a gate voltage of the thin film transistor 2' in the related art, and the ordinate is the leakage current of the thin film transistor 2'. It can be clearly seen from the figure that, when the gate voltage is the same, such as 1.5V, the source voltage is set to be equal to 0, the leakage current increases as the increase of the drain voltage Vd (Vd1<Vd2<Vd3), so that the three curves do not coincide. The reason why the three curves do not coincide is the drain induced barrier lowering caused by the short-channel effect, thereby causing the threshold voltage of the thin-film transistor 2' to drift, and the threshold voltage decreases with the increase of the drain voltage Vd. Therefore, the drain voltage Vd has a great influence on the threshold voltage, and the small the threshold voltage of the thin film transistor 2' is, the high the probability that the thin film transistor 2 is turned on by mistake is. As a result, the stability of the thin film transistor 2' is poor.

On a premise that the length of the active layer 21 is the same, referring to FIGS. 2A to 2D, the length of the channel region 200 in the embodiments of the present disclosure is L. Referring to FIG. 3A, the length of the channel region 200' in the related art is Lo. It can be clearly seen that, the length L of the channel region 200 in the embodiments of the present disclosure is greater than the length Lo of the channel region 200' in the related art. Referring to FIG. 2A, in a case where the first electrode region 211 and the second electrode region 212 are both LDD regions, the length of the LDD regions is also larger than that of the third doped regions 23' shown in FIG. 3A in the related art, so that an ability of reducing the leakage current and the drain voltage Vd is stronger. Therefore, the overall performance of the thin film transistor 2 in the embodiments of the present disclosure is superior to the performance of the thin film transistor 2' in the related art.

In the embodiments of the present disclosure, the thin film transistor 2 includes the third doped pattern 22, and the third doped pattern 22 is disposed between the first electrode 24 and the first electrode region 211, that is, the third doped pattern 22 is not located in the active layer 21. Due to the change of the position of the third doped pattern 22, the length of the channel region 200 in the active layer 21 may be set to be relatively large, so as to reduce the short-channel effect. In addition, the size of the third doped pattern 22 may also be set to be relatively large, and in a case where the third doped pattern 22 is the LDD region, the equivalent resistance of the third doped pattern 22 is relatively large, so that the ability of reducing the leakage current and the drain voltage Vd is stronger. Furthermore, in a case where the first electrode region 211 and the second electrode region 212 are LDD regions, the lengths of the LDD regions are larger than the length of the third doped regions 23' in the related art, thus the ability of reducing the leakage current and the drain voltage Vd is stronger. In a case where the third doped pattern 22, or the first electrode region 211 and the second electrode region 212 have a stronger ability of reducing the drain voltage Vd, for the same thin film transistor 2, the threshold voltages corresponding to different drain voltages Vd are all relatively large, thus the thin film transistor 2 is not easy to be turned on. As a result, the probability that the thin film transistor 2 is turned on by mistake is low, the influence of the drain voltage Vd on the threshold voltage is reduced, and in turn, the influence of the short-channel effect on the thin film transistor 2 may be further improved. Therefore, the overall performance of the thin film transistor 2 in the embodiments of the present disclosure is better.

In some embodiments, referring to FIGS. 4A to 4D, the thin film transistor 2 further includes a fourth doped pattern 23 disposed between the second electrode 25 and the second electrode region 212. The fourth doped pattern 23 is in direct contact with the second electrode 25 and the second electrode region 212. The fourth doped pattern 23 has a fourth ion doping concentration, and the fourth ion doping concentration is different from the second ion doping concentration.

The fourth doped pattern 23 is used to form an ohmic contact with the second electrode 25; in a case where the fourth ion doping concentration is less than the second ion doping concentration, the fourth doped pattern 23 is used to reduce the magnitude of the leakage current and the drain voltage Vd of the thin film transistor 2; in a case where the fourth ion doping concentration is greater than the second ion doping concentration, the fourth doped pattern 23 has a coupling function.

Figure 4A:
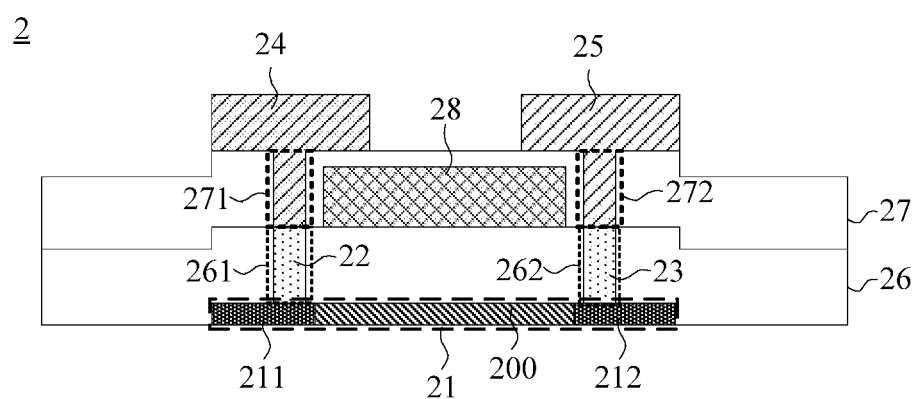
FIGS. 4A to 4D are structural diagrams of other thin film transistors, in accordance with some embodiments of the present disclosure.

For example, referring to FIG. 4A, the first ion doping concentration is equal to or approximately equal to the second ion doping concentration, the third ion doping concentration is equal to or approximately equal to the fourth ion doping concentration, and the first ion doping concentration is greater than the third ion doping concentration. In this case, the third doped pattern 22 and the fourth doped pattern 23 are LDD regions for reducing the magnitude of the leakage current and the drain voltage Vd of the thin film transistor 2.

Figure 4B:
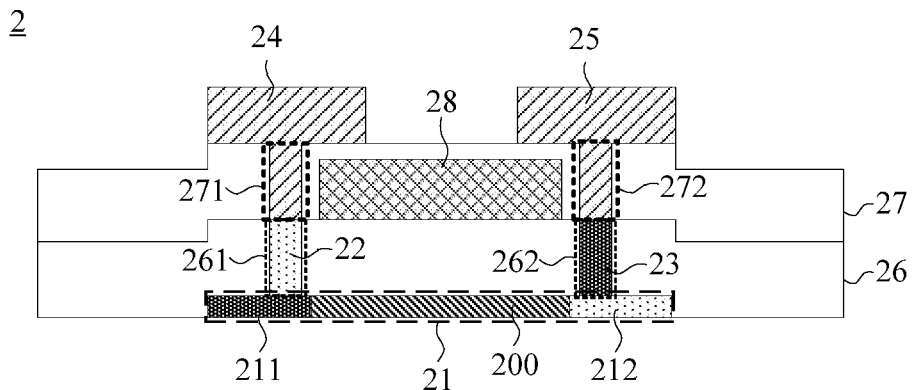

Referring to FIG. 4B, the first ion doping concentration is equal to or approximately equal to the fourth ion doping concentration, the second ion doping concentration is equal to or approximately equal to the third ion doping concentration, and the first ion doping concentration is greater than the second ion doping concentration. In this case, the third doped pattern 22 and the second electrode region 212 are LDD regions for reducing the magnitude of the leakage current and the drain voltage Vd of the thin film transistor 2.

Figure 4C:
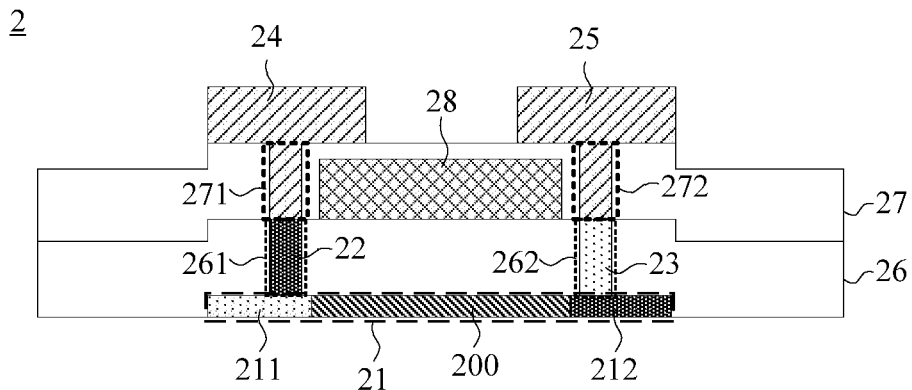

Referring to FIG. 4C, the first ion doping concentration is equal to or approximately equal to the fourth ion doping concentration, the second ion doping concentration is equal to or approximately equal to the third ion doping concentration, and the first ion doping concentration is less than the third ion doping concentration. In this case, the first electrode region 211 and the fourth doped pattern 23 are LDD regions for reducing the magnitude of the leakage current and the drain voltage Vd of the thin film transistor 2.

Figure 4D:
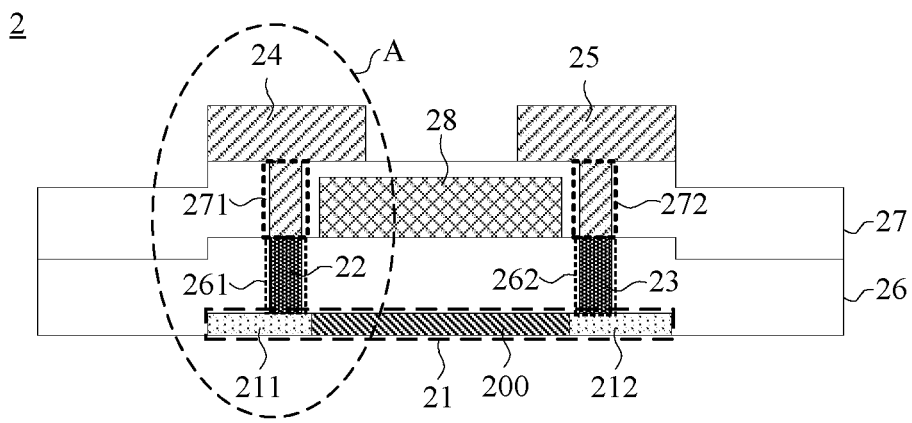

Referring to FIG. 4D, the first ion doping concentration is equal to or approximately equal to the second ion doping concentration, the third ion doping concentration is equal to or approximately equal to the fourth ion doping concentration, and the first ion doping concentration is less than the third ion doping concentration. In this case, the first electrode region 211 and the second electrode region 212 are LDD regions for reducing the magnitude of the leakage current and the drain voltage Vd of the thin film transistor 2.

In a case where the thin film transistor 2 further includes the fourth doped pattern 23, the fourth doped pattern 23 is located between the second electrode 25 and the second electrode region 212, so that the third doped region 23' may not be provided in the active layer 21, and the length of the fourth doped pattern 23 may be set to be greater than the length of the third doped region 23'. As a result, the fourth doped pattern 23 may not only further increase the length of the channel region 200 of the thin film transistor 2 to reduce the short-channel effect, but also increase the area of the LDD region in the thin film transistor 2 in a case where the fourth ion doping concentration is less than the second ion doping concentration, so as to further improve the short-channel effect and reduce the drain voltage Vd.

In some embodiments, referring to FIGS. 2A to 2D and 4A to 4D, the thin film transistor 2 further includes a gate insulating layer 26 and a gate 28 that are stacked in the thickness direction of the active layer 21. The gate insulating layer 26 and the gate 28 are disposed between the active layer 21 and both the first electrode 24 and the second electrode 25.

The gate insulating layer 26 is located between the active layer 21 and the gate 28. The gate insulating layer 26 is provided with a first via hole 261 therein, and an orthogonal projection of the first via hole 261 on the active layer 21 is located within a range of an overlapping region between the first electrode region 211 and an orthogonal projection of the first electrode 24 on the active layer 21. The third doped pattern 22 is located in the first via hole 261.

Since the gate 28 is located above the active layer 21, the thin film transistor 2 is a top-gate thin film transistor 2. The gate 28 in the top-gate thin film transistor 2 plays a role of self-alignment in a process of performing ion doping on the first electrode region 211 and the second electrode region 212, so as to avoid using a mask in the process of performing ion doping, thereby reducing production costs.

Figure 4E:
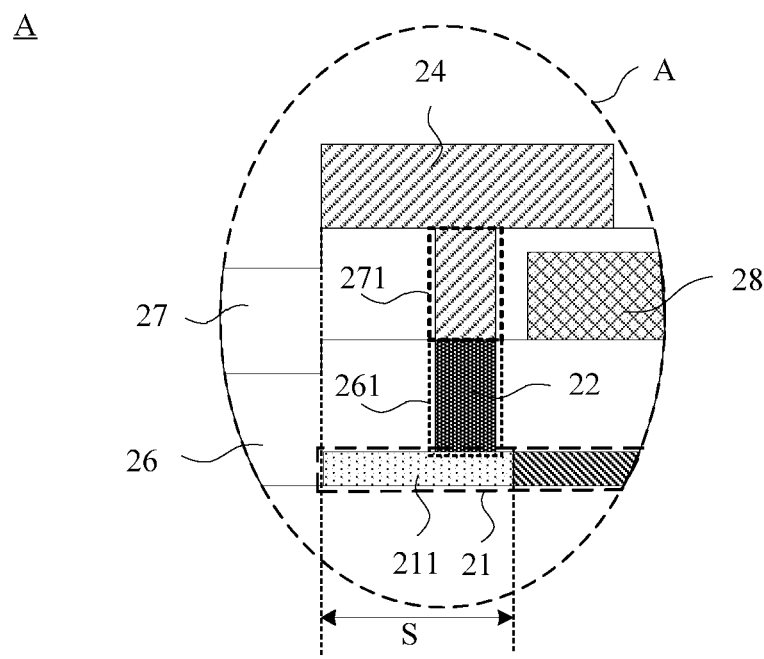
FIG. 4E is an enlarged diagram of a portion A in FIG. 4D.

In an example in which the orthogonal projection of the first via hole 261 on the active layer 21 is a circle, referring to FIG. 4E, a length of the overlapping region between the orthogonal projection of the first electrode 24 on the active layer 21 and the first electrode region 211 is S, and a length of the orthogonal projection of the first via hole 261 on the active layer 21 is a diameter of the circle, which is less than S.

Figure 5A:
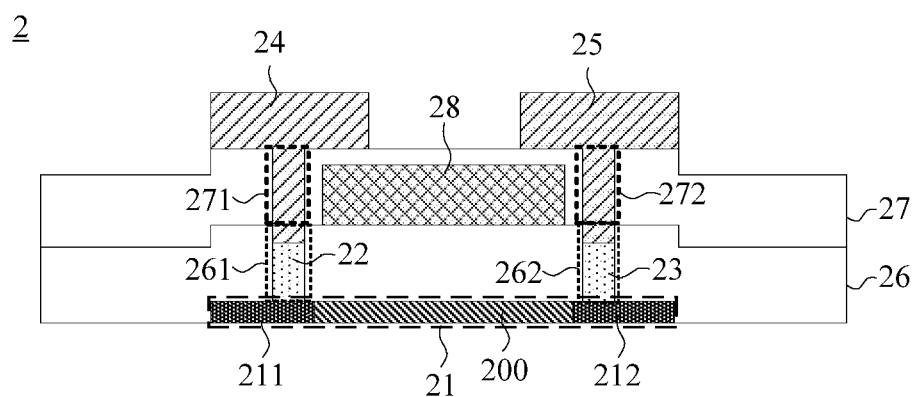
FIGS. 5A to 5C are structural diagrams of other thin film transistors, in accordance with some embodiments of the present disclosure.
Figure 5B:
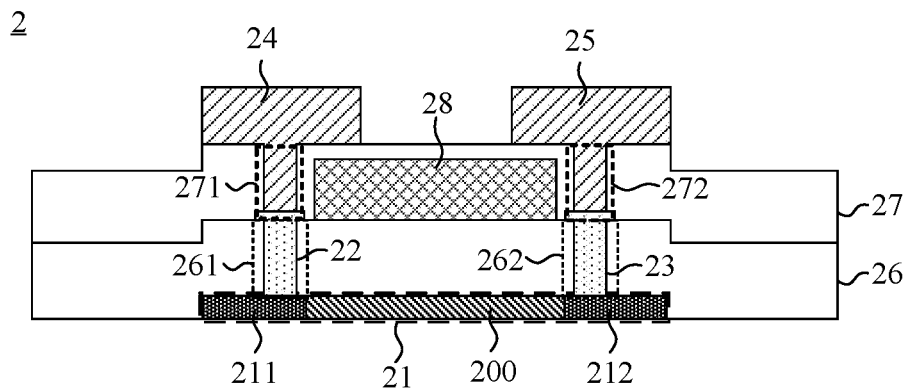
Figure 5C:
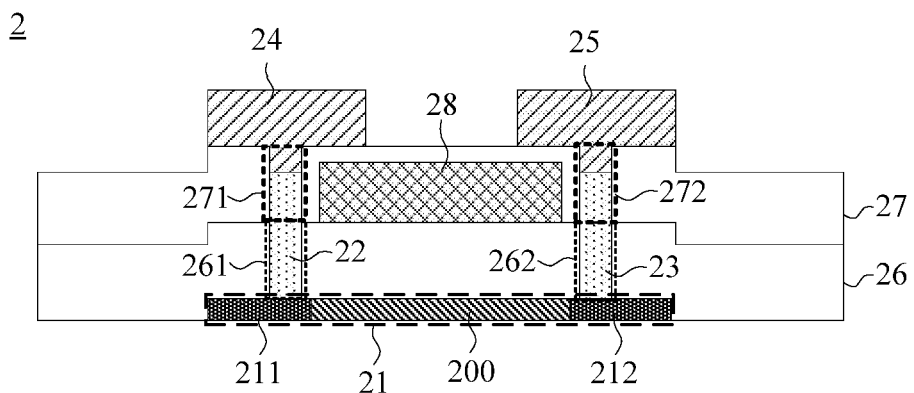

The third doped pattern 22 is located in the first via hole 261. Referring to FIGS. 2A to 2D and 4A to 4D, a thickness of the third doped pattern 22 may be equal to or approximately equal to a depth of the first via hole 261. Referring to FIG. 5A, the thickness of the third doped pattern 22 may also be less than the depth of the first via hole 261. Referring to FIGS. 5B and 5C, the thickness of the third doped pattern 22 may also be greater than the depth of the first via hole 261.

In a case where the orthogonal projection of the first via hole 261 on the active layer 21 is located within the range of the overlapping region between the first electrode region 211 and the orthogonal projection of the first electrode 24 on the active layer 21, the first via hole 261 may be disposed in the thickness direction of the active layer 21, which is simple; furthermore, the first via hole 261 may be formed in the gate insulating layer 26 after the gate insulating layer 26 is manufactured, and then the third doped pattern 22 is manufactured. The thickness of the third doped pattern 22 may be set according to actual performance requirements of the thin film transistor 2.

In some embodiments, referring to FIGS. 4A to 4D and 5A to 5C, in a case where the thin film transistor 2 further includes the fourth doped pattern 23, the gate insulating layer 26 is further provided with a second via hole 262 therein. An orthogonal projection of the second via hole 262 on the active layer 21 is located within a range of an overlapping region between the second electrode region 212 and an orthogonal projection of the second electrode 25 on the active layer 21. The fourth doped pattern 23 is located in the second via hole 262.

The fourth doped pattern 23 is located in the second via hole 262, referring to FIGS. 4A to 4D, a thickness of the fourth doped pattern 23 is equal to or approximately equal to a depth of the second via hole 262. Referring to FIG. 5A, the thickness of the fourth doped pattern 23 is less than the depth of the second via hole 262. Referring to FIGS. 5B and 5C, the thickness of the fourth doped pattern 23 is greater than the depth of the second via hole 262.

Beneficial effects of the fourth doped pattern 23 disposed in the second via hole 262 are the same as beneficial effects of the third doped pattern 22 disposed in the first via hole 261, details will not be repeated herein.

In some embodiments, referring to FIGS. 4A and 5A to 5C, the first ion doping concentration is equal to or approximately equal to the second ion doping concentration, the third ion doping concentration is equal to or approximately equal to the fourth ion doping concentration, and the first ion doping concentration is greater than the third ion doping concentration.

In this structure, the third doped pattern 22 and the fourth doped pattern 23 are LDD regions, and equivalent resistances of the third doped pattern 22 and the fourth doped pattern 23 are relatively large, which may reduce the drain voltage Vd and the leakage current to the greater extent.

Figure 6A:
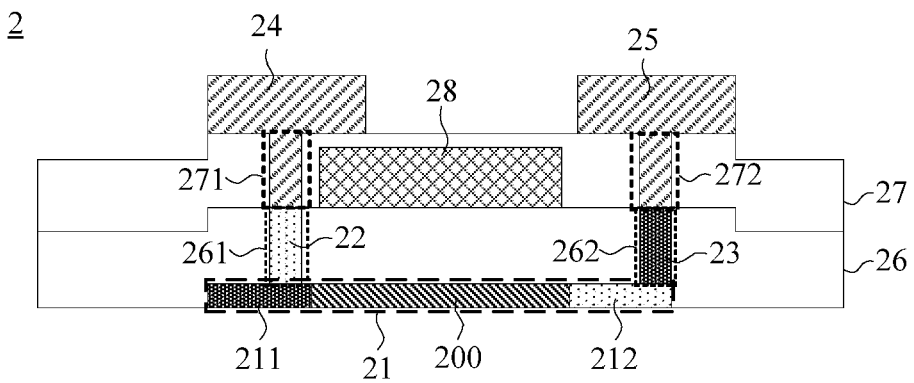
FIGS. 6A to 6C are structural diagrams of other thin film transistors, in accordance with some embodiments of the present disclosure.
Figure 6B:
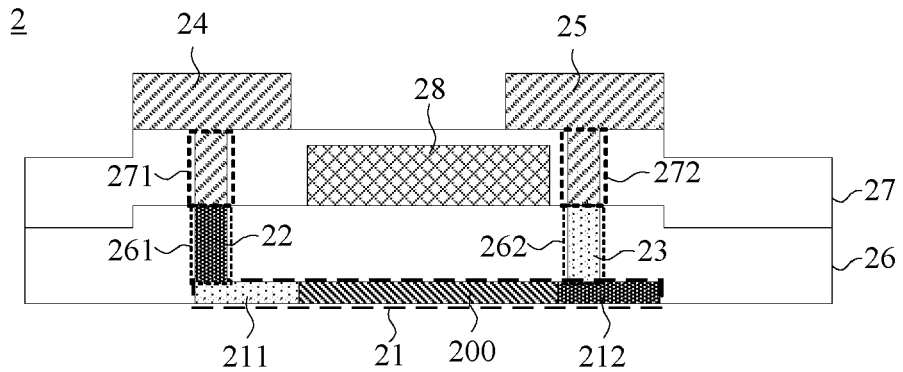
Figure 6C:
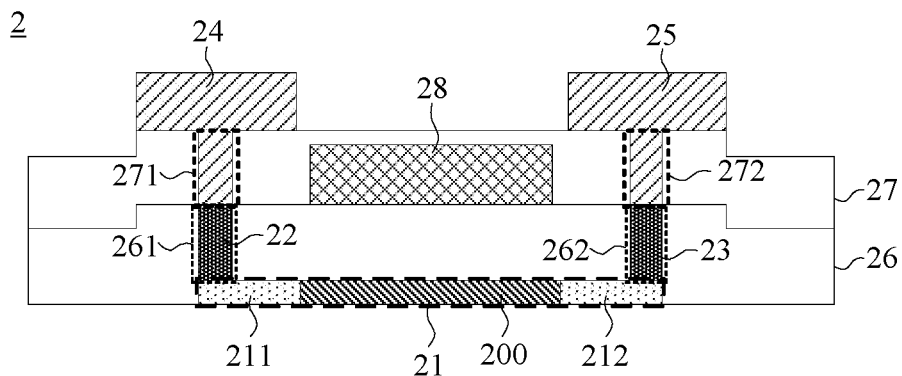

In some other embodiments, referring to FIGS. 6A to 6C, in a case where the first ion doping concentration is less than the third ion doping concentration, and/or the second ion doping concentration is less than the fourth ion doping concentration, a border of an orthogonal projection of the third doped pattern 22 on the active layer 21 partially coincides with a border of the first electrode region 211, and/or, a border of an orthogonal projection of the fourth doped pattern 23 on the active layer 21 partially coincides with a border of the second electrode region 212. Referring to FIG. 6A, the first ion doping concentration is equal to or approximately equal to the fourth ion doping concentration, the second ion doping concentration is equal to or approximately equal to the third ion doping concentration, and the first ion doping concentration is greater than the second ion doping concentration. In this case, a side of the fourth doped pattern 23 away from the third doped pattern 22 is aligned with a side of the second electrode region 212 away from the first electrode region 211.

Referring to FIG. 6B, the first ion doping concentration is equal to or approximately equal to the fourth ion doping concentration, the second ion doping concentration is equal to or approximately equal to the third ion doping concentration, and the first ion doping concentration is less than the second ion doping concentration. In this case, a side of the third doped pattern 22 away from the fourth doped pattern 23 is aligned with a side of the first electrode region 211 away from the second electrode region 212.

Referring to FIG. 6C, the first ion doping concentration is equal to or approximately equal to the second ion doping concentration, the third ion doping concentration is equal to or approximately equal to the fourth ion doping concentration, and the first ion doping concentration is less than the third ion doping concentration. In this case, the side of the third doped pattern 22 away from the fourth doped pattern 23 is aligned with the side of the first electrode region 211 away from the second electrode region 212, and the side of the fourth doped pattern 23 away from the third doped pattern 22 is aligned with the side of the second electrode region 212 away from the first electrode region 211.

Since the first electrode region 211 and/or the second electrode region 212 are LDD regions, in a case where the side of the third doped pattern 22 away from the fourth doped pattern 23 is aligned with the side of the first electrode region 211 away from the second electrode region 212, and/or the side of the fourth doped pattern 23 away from the third doped pattern 22 is aligned with the side of the second electrode region 212 away from the first electrode region 211, carriers transported by the third doped pattern 22 and the fourth doped pattern 23 pass through the entirety of the first electrode region 211 and the second electrode region 212, and areas, passed through by the carriers, of the first electrode region 211 and the second electrode region 212 are relatively large, thus the equivalent resistances of the first electrode region 211 and the second electrode region 212 are relatively large, so that the drain voltage Vd is further reduced.

It will be understood by those skilled in the art that, referring to FIG. 4D, in the thin film transistor 2 of this structure, the carriers transported by the third doped pattern 22 pass through a portion of the first electrode region 211 that is in contact with the third doped pattern 22 and is located on a side proximate to the second electrode region 212, and the carriers transported by the fourth doped pattern 23 pass through a portion of the second electrode region 212 that is in contact with the fourth doped pattern 23 and is located on a side proximate to the first electrode region 211, that is, the carriers do not pass through the entirety of the first electrode region 211 and the second electrode region 212. The equivalent resistances of the first electrode region 211 and the second electrode region 212 are each calculated according to an area of the respective portion that the carriers pass through. Therefore, the equivalent resistances of the first electrode region 211 and the second electrode region 212 in FIG. 4D are not the same as the equivalent resistances of the first electrode region 211 and the second electrode region 212 in FIG. 6C, respectively.

In some embodiments, referring to FIG. 5A, the height of the third doped pattern 22 is less than or equal to the depth of the first via hole 261, and a height of the fourth doped pattern 23 is less than or equal to the depth of the second via hole 262, which facilitates to manufacture the third doped pattern 22 in the first via hole 261 and to manufacture the fourth doped pattern 23 in the second via hole 262 after the gate insulating layer 26 is formed.

In some embodiments, referring to FIGS. 4A to 4D, 5A to 5C, 6A to 6C and 7A to 7B, the thin film transistor 2 further includes an interlayer insulating layer 27 disposed on a side of the gate 28 away from the active layer 21. The interlayer insulating layer 27 is provided with a third via hole 271 and a fourth via hole 272 therein. The third via hole 271 is communicated with the first via hole 261, and the fourth via hole 272 is communicated with the second via hole 262. An orthogonal projection of the third via hole 271 on the active layer 21 and the orthogonal projection of the first via hole 261 on the active layer 21 are located within the range of the overlapping region between the first electrode region 211 and the orthogonal projection of the first electrode 24 on the active layer 21; an orthogonal projection of the fourth via hole 272 on the active layer 21 and the orthogonal projection of the second via hole 22 on the active layer 21 are located within the range of the overlapping region between the second electrode region 212 and the orthogonal projection of the second electrode 25 on the active layer 21.

For example, referring to FIGS. 4A to 4D, 5A to 5C and 6A to 6C, a size of the third via hole 271 and a size of the first via hole 261 are the same or approximately the same, a size of the fourth via hole 272 and a size of the second via hole 262 are the same or approximately the same. Based on this, in some other embodiments, the size of the first via hole 261 and the size of the second via hole 262 are the same or approximately the same. Based on this, for example, longitudinal sections of the first via hole 261 to the fourth via hole 272 are all in a shape of a rectangle, and the sizes thereof are all the same or approximately the same, which facilitates to manufacture the first via hole 261, the third via hole 271, the second via hole 262 and the fourth via hole 272 simultaneously.

Figure 7A:
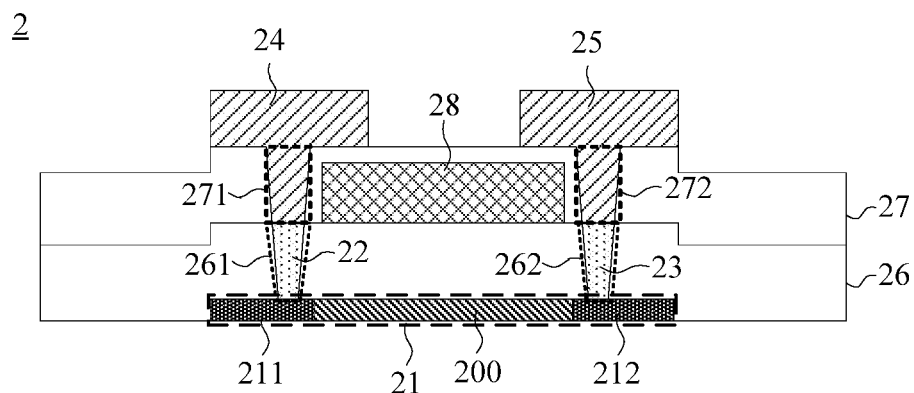
FIGS. 7A and 7B are structural diagrams of other thin film transistors, in accordance with some embodiments of the present disclosure.

For another example, referring to FIG. 7A, the size of the first via hole 261 and the size of the second via hole 262 are the same or approximately the same, and the size of the third via hole 271 and the fourth via hole 272 are the same or approximately the same. For example, the longitudinal sections of the first via hole 261 to the fourth via hole 272 are all in a shape of an inverted trapezoid, and in the longitudinal sections, a length of a top base of the first via hole 261 is equal to or approximately equal to a length of a bottom base of the third via hole 271, and a length of a top base of the second via hole 262 is equal to or approximately equal to a length of a bottom base of the fourth via hole 272. In this case, it facilitates to manufacture the first via hole 261 and the third via hole 271, and the second via hole 262 and the fourth via hole 272 simultaneously.

Figure 7B:
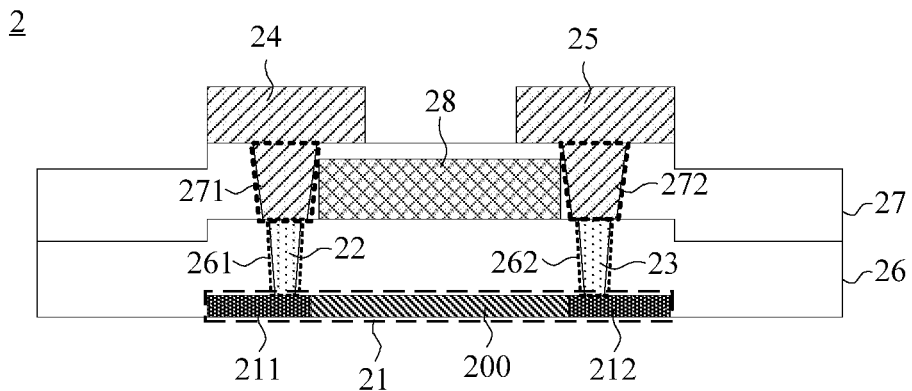

For another example, referring to FIG. 7B, the size of the first via hole 261 and the size of the second via hole 262 are the same or approximately the same, and the size of the third via hole 271 and the size of the fourth via hole 272 are the same or approximately the same. Based on this, a diameter of the third via hole 271 is, for example, greater than a diameter of the first via hole 261, and a diameter of the fourth via hole 272 is, for example, greater than a diameter of the second via hole 262. In a case where the longitudinal sections of the first via hole 261 to the fourth via hole 272 are all in a shape of a rectangle, the diameters of the top base and the bottom base of any one from the first via hole 261 to the fourth via hole 272 are the same or approximately the same. In a case where the longitudinal sections of the first via hole 261 to the fourth via hole 272 are all in a shape of an inverted trapezoid, the diameters of the top base and the bottom base of any one from the first via hole 261 to the fourth via hole 272 are not the same. For any via hole, the diameter of the top base thereof is greater than the diameter of the bottom base thereof, that is, there is a maximum diameter and a minimum diameter. In this case, the description that "the diameter of the third via hole 271 is, for example, greater than the diameter of the first via hole 261" may be understood that, the minimum diameter of the third via hole 271 is greater than the maximum diameter of the first via hole 261; the description that "the diameter of the fourth via hole 272 is, for example, greater than the diameter of the second via hole 262" may be understood that, the minimum diameter of the fourth via hole 272 is greater than the maximum diameter of the second via hole.

Based on this, for example, referring to FIG. 7B, the longitudinal sections of the first via hole 261 to the fourth via hole 272 are all in a shape of an inverted trapezoid, and in the longitudinal sections, the length of the top base of the first via hole 261 (corresponding to the maximum diameter of the first via hole 261) is less than the length of the bottom base of third via hole 271 (corresponding to the minimum diameter of the third via hole 271), the length of the top base of the second via hole 262 (corresponding to the maximum diameter of the second via hole 262) is less than the length of the bottom base of the fourth via hole 272 (corresponding to the minimum diameter of the fourth via hole 272). With this structure, it is possible to ensure that a contact area between a side of the first electrode 24 proximate to the active layer 21 and a side of the third doped pattern 22 away from the active layer 21, and a contact area between a side of the second electrode 25 proximate to the active layer 21 and a side of the fourth doped region 23 away from the active layer 21 are relatively large, thereby ensuring a good coupling stability between the first electrode 24 and the third doped pattern 22, and between the second electrode 25 and the fourth doped pattern 23.

In some embodiments, referring to FIG. 5C, the third doped pattern 22 is further located in the third via hole 271, and the fourth doped pattern 23 is further located in the fourth via hole 272. In the process of manufacturing the thin film transistor 2 with this structure, the first via hole 261 to the fourth via hole 272 may be manufactured after the interlayer insulating layer 27 is manufactured, and a punching process may be saved when the first via hole 261 and the fourth via hole 272 are manufactured simultaneously, and the second via hole 262 and the fourth via hole 272 are manufactured simultaneously. Furthermore, the thicknesses of the third doped pattern 22 and the fourth doped pattern 23 may be set to be relatively large, especially in a case where the third doped pattern 22 and the fourth doped pattern 23 are LDD regions, the equivalent resistances of the third doped pattern 22 and the fourth doped pattern 23 may be further increased, thereby further reducing the drain voltage Vd and reducing the short-channel effect.

In some embodiments, the thickness of the third doped pattern 22 is equal to or approximately equal to the thickness of the fourth doped pattern 23, which is convenient to manufacture the first electrode 24 on the upper side of the third doped pattern 22 and to manufacture the second electrode 25 on the upper side of the fourth doped pattern 23 simultaneously; in addition, in a case where the thickness of the third doped pattern 22 is equal to or greater than the depth of the first via hole 261, the thickness of the fourth doped pattern 23 is equal to or greater than the depth of the second via hole 262, and the thickness of the third doped pattern 22 is equal to or approximately equal to the fourth doped pattern 23, it is convenient to form other film layers (e.g., the interlayer insulating layer 27, the first electrode 24 and the second electrode 25) on the third doped pattern 22 and the fourth doped pattern 23.

The thin film transistor 2 in the embodiments of the present disclosure may be an N-type transistor or a P-type transistor. The embodiments of the present disclosure are described by taking the N-type transistor as an example.

Based on this, in some embodiments, materials of the third doped pattern 22 and the fourth doped pattern 23 include, for example, a semiconductor material including N+ ions, such as N+ a-si. Doping ions of the first electrode region 211 and the second electrode region 212 are also, for example, N+ ions. Further, the N+ ions are, for example, phosphorus (P) ions, and the doping amount corresponding to the first ion doping concentration and the second ion doping concentration is, for example, b $5\times10^{14}/cm^2$ to $1\times10^{15}/cm^2$, the doping amount corresponding to the third ion doping concentration and the fourth ion doping concentration is, for example, $5\times10^{13}$ $cm^2$ to $1\times10^{14}$ $cm^2$.

It will be understood by those skilled in the art that, although the calculation methods of the doping amount and the doping concentration are different, there is a corresponding relationship between the doping amount and the doping concentration, that is, the larger the doping amount, the higher the doping concentration. Therefore, the relationship between the doping concentrations may be measured by the relationship between the doping amounts.

In conjunction with FIGS. 2C, 2D, 4A, 4C, and 5A to 5C, since both the third doped region 23' and the fourth doped pattern 23 are able to be used as LDD regions, it will be understood by those skilled in the art that, the third doped region 23' and the fourth doped pattern 23 cannot coexist in the thin film transistor 2, and the fifth doping concentration may be equal to or approximately equal to the fourth ion doping concentration.

Figure 8:
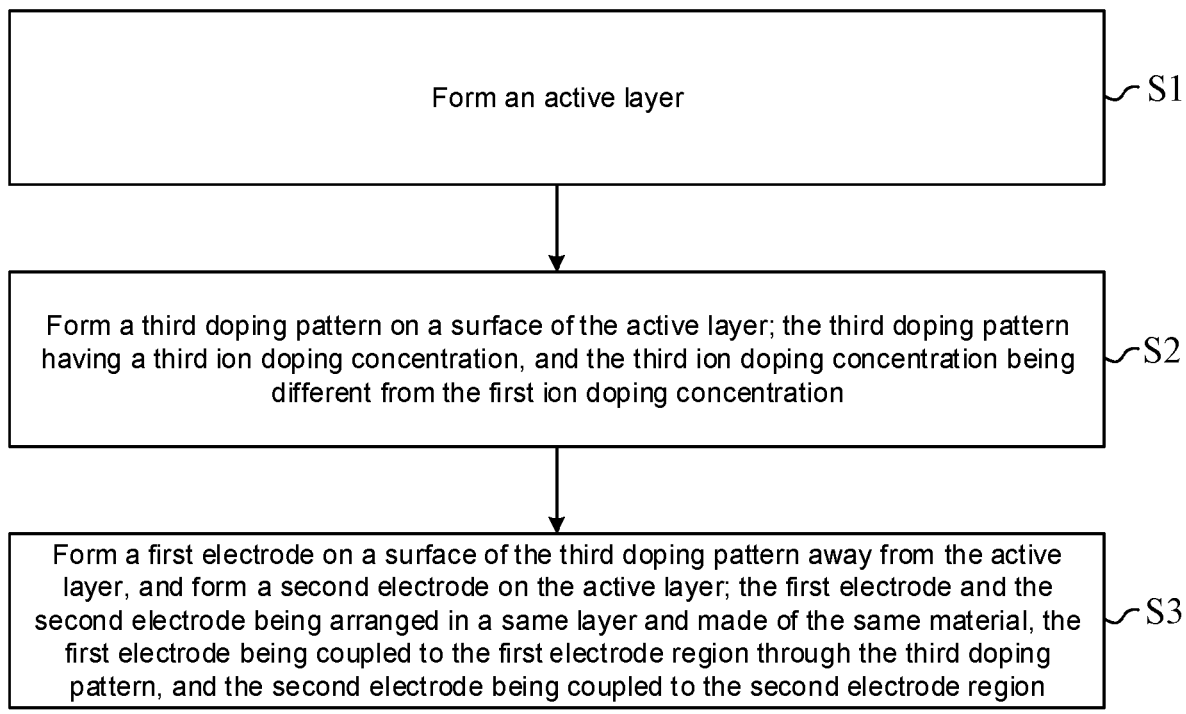
FIG. 8 is a flow diagram of a manufacturing method for a thin film transistor, in accordance with some embodiments of the present disclosure.

Referring to FIG. 8, embodiments of the present disclosure provide a manufacturing method for a thin film transistor 2, the method includes following steps (S1 to S3).

In S1, referring to FIGS. 2A to 2D, an active layer 21 is formed.

The active layer 21 has a channel region 200, and a first electrode region 211 and a second electrode region 212 that are located on two opposite sides of the channel region 200 in a direction perpendicular to a thickness direction of the active layer 21. The first electrode region 211 and the second electrode region 212 are ion doped regions, the first electrode region 211 has a first ion doping concentration, and the second electrode region 212 has a second ion doping concentration. The material of the active layer 21 is polysilicon.

Referring to FIGS. 2C and 2D, the active layer 21 may further include a third doped region 23'. An ion doping concentration of the third doped region 23' is a fifth doping concentration, and the fifth doping concentration is different from the second ion doping concentration. The third doped region 23' is used to form the LDD region.

In S2, a third doped pattern 22 is formed on a surface of the active layer 21. The third doped pattern 22 has a third ion doping concentration, and the third ion doping concentration is different from the first ion doping concentration.

In S3, a first electrode 24 is formed on a surface of the third doped pattern 22 away from the active layer 21, and a second electrode 25 is formed on the active layer 21. The first electrode 24 and the second electrode 25 are arranged in a same layer and are made of the same material. The first electrode 24 is coupled to the first electrode region 211 through the third doped pattern 22, and the second electrode 25 is coupled to the second electrode region 212.

In some embodiments, referring to FIGS. 4A to 4D, a fourth doped pattern 23 is formed while the third doped pattern 22 is formed on the active layer 21. The fourth doped pattern 23 is coupled to the second electrode region 212, the fourth doped pattern 23 has a fourth ion doping concentration, and the fourth ion doping concentration is different from the second ion doping concentration.

Forming the second electrode 25 on the active layer 21 includes forming the second electrode 25 on the side of the fourth doped pattern 23 away from the active layer 21. The fourth doped pattern 23 is coupled to the second electrode 25.

The first electrode 24 and the second electrode 25 are arranged in the same layer and made of the same material, and the material of the first electrode 24 and the second electrode 25 is, for example, at least one of conductive metals such as silver (Ag), aluminum (Al), and titanium (Ti).

Figure 9A:
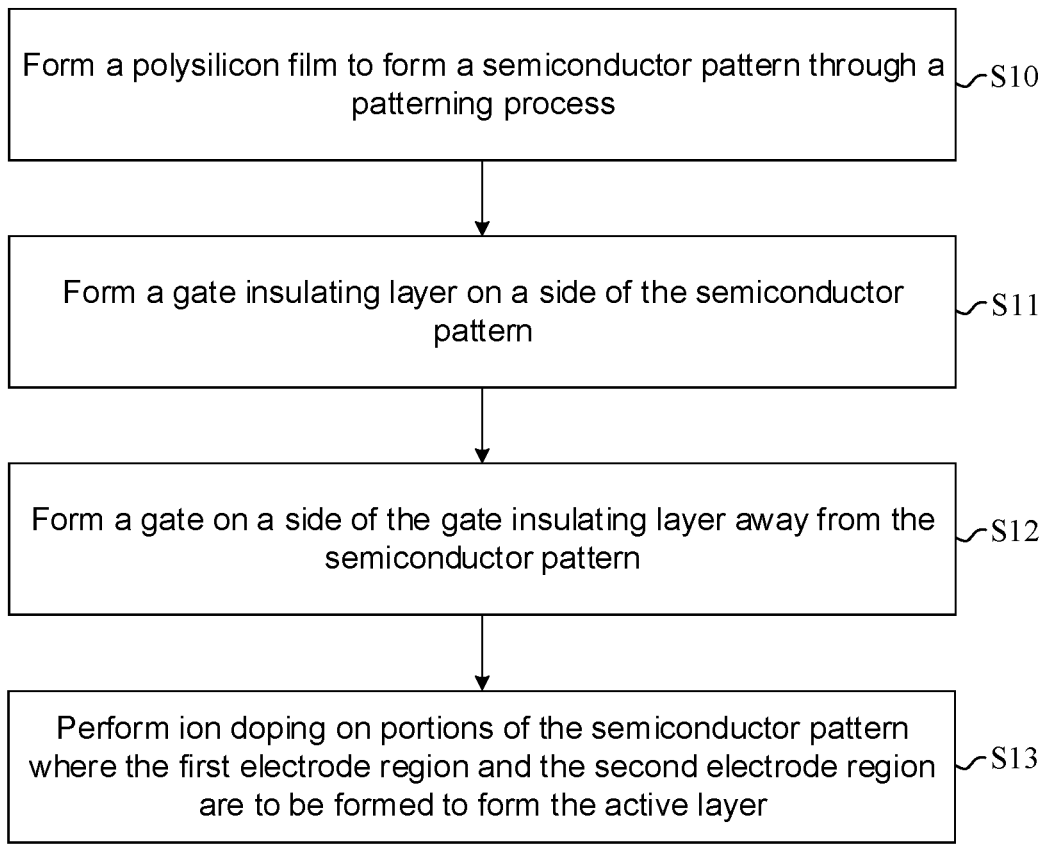
FIG. 9A is a flow diagram of a process of manufacturing an active layer, in accordance with some embodiments of the present disclosure.

In some embodiments, referring to FIG. 9A, forming the active layer 21 includes following steps (S10 to S13).

In S10, referring to FIG. 9B, a polysilicon film is formed to form a semiconductor pattern through a patterning process.

A thickness of the polysilicon film is, for example, 400 Å to 600 Å.

In S11, referring to FIG. 9B, a gate insulating layer 26 is formed on a side of the semiconductor pattern 210.

A thickness of the gate insulating layer 26 is, for example, 1200 Å.

The gate insulating layer 26 may be a single-layer structure, and a material of the single-layer structure is, for example, silicon oxide (SiO); the gate insulating layer 26 may also be a laminated structure laminated in a thickness direction of the thin film transistor 2, such as a double-layer laminated structure, in which a material of one layer proximate to the semiconductor pattern 210 is, for example, silicon oxide, and a material of the other layer is, for example, silicon nitride (SiN).

In S12, referring to FIG. 9B, a gate 28 is formed on a side of the gate insulating layer 26 away from the semiconductor pattern 210.

A material of the gate 28 is, for example, molybdenum (Mo), and a thickness of the gate 28 is, for example, 200 nm to 350 nm.

In S13, referring to FIG. 9C, portions of the semiconductor pattern 210 where the first electrode region and the second electrode region are to be formed are doped with ions, so as to form the active layer 21.

Since the gate 28 has been formed on the gate insulating layer 26, the gate plays a role of self-alignment. Thus, a mask is not required when the semiconductor pattern 210 is doped with ions, and doped ions 2100 may enter the portions of the semiconductor pattern 210 where the first electrode region and the second electrode region are to be formed, so as to form the first electrode region 211 and the second electrode region 212.

In some embodiments, the first ion doping concentration is equal to or approximately equal to the second ion doping concentration.

For example, in a case where the portions of the semiconductor pattern 210 where the first electrode region and the second electrode region are to be formed is heavily doped with phosphorus (P) ions, the doping amount for each portion is, for example, $5 1 \times 10^{14}/cm^2$ to $1 \times 10^{15}/cm^2$, so that the first ion doping concentration and the second ion doping concentration are relatively large, so as to enable the first electrode region 211 and the second electrode region 212 to be HDD regions.

In some embodiments, forming the polysilicon film, for example, includes:

depositing an amorphous silicon film, so that amorphous silicon (a-si) in the amorphous silicon film is converted into polysilicon through laser irradiation to form a polysilicon film; or depositing polysilicon directly to form the polysilicon film.

For example, laser annealing is performed by an excimer laser anneal device, so that amorphous silicon in the amorphous silicon film may be converted into polysilicon to form the polysilicon film.

It will be understood by those skilled in the art that, there is a need to provide a substrate for supporting film layers in the process of manufacturing the thin film transistor 2, thus the polysilicon film needs to be manufactured on the substrate.

In some other embodiments, in order to avoid the influence of hydrogen (H) ions in the substrate on the active layer 21, a buffer layer may be manufactured on the substrate before the polysilicon film is formed. The buffer layer is, for example, a laminated structure of a silicon nitride layer and a silicon oxide layer that are laminated in a thickness direction of the substrate. A thickness of the silicon nitride layer is, for example, 500 Ụ, and a thickness of the silicon oxide layer is, for example, 3000 Ụ, and the silicon nitride layer is closer to the substrate than the silicon oxide layer.

Based on this, referring to FIG. 10A, forming the third doped pattern 22 on a side of the active layer 21 includes following steps (S20 and S21).

Figure 10B:
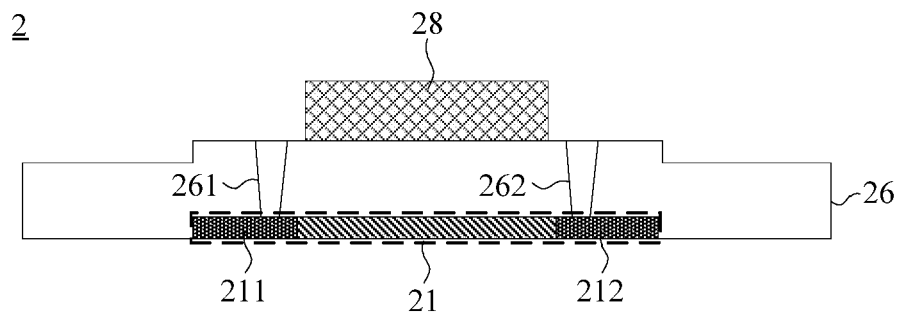
FIG. 10B is a diagram of a process of manufacturing a third doped pattern and a fourth doped pattern, in accordance with some embodiments of the present disclosure.
Figure 10C:
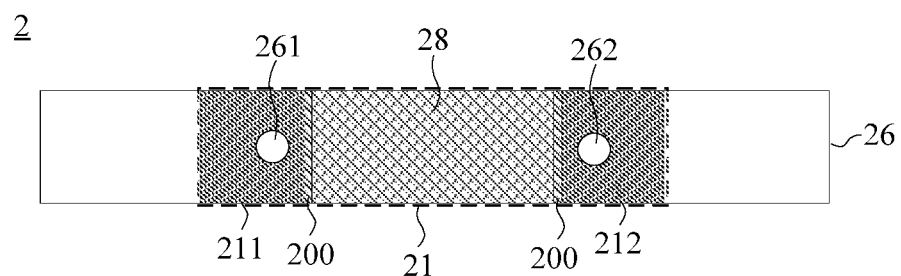
FIG. 10C is a top view of FIG. 10B.

In S20, referring to FIGS. 10B and 10C, a first via hole 261 is formed in the gate insulating layer 26, and an orthogonal projection of the first via hole 261 on the active layer 21 is located within a range of the first electrode region 211.

The first via hole 261 penetrates the gate insulating layer 26, and a longitudinal section of the first via hole 261 is, for example, in a shape of an inverted trapezoid.

Figure 10D:
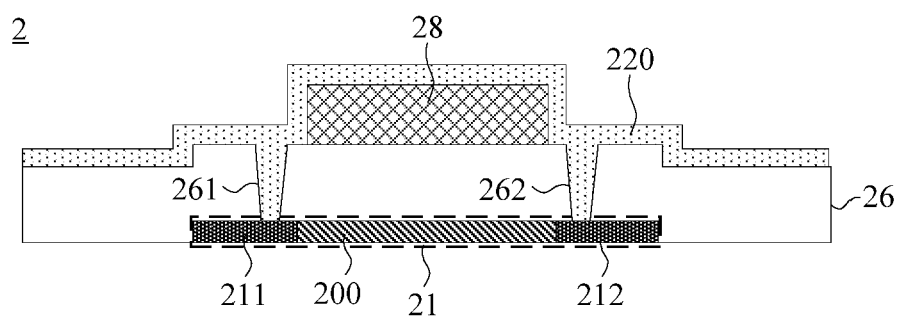
FIG. 10D is another diagram of a process of manufacturing a third doped pattern and a fourth doped pattern, in accordance with some embodiments of the present disclosure.

In S21, referring to FIGS. 10D and 7A, a doped film 220 is formed on sides, away from the active layer 21, of the gate insulating layer 26 and the gate 28, the doped film 220 is patterned and the third doped pattern 22 is formed in the first via hole 261.

For example, in a case where the third ion doping concentration of the third doped pattern 22 is lower than the doping concentration of the first electrode region 211, the third doped pattern 22 is an LDD region.

Based on this, in some other embodiments, referring to FIGS. 10B and 10C, a second via hole 262 is formed while the first via hole 261 is formed in the gate insulating layer 26, and an orthogonal projection of the second via hole 262 on the active layer 21 is located within a range of the second electrode region 212.

A size of the second via hole 262 is, for example, the same or approximately the same as a size of the first via hole 261.

Referring to FIGS. 10D and 7A, the doped film 220 is formed on the sides of the gate insulating layer 26 and the gate 28 away from the active layer 21, and the doped film 220 is patterned to further form a fourth doped pattern 23 in the second via hole 262 while the third doped pattern 22 is formed in the first via hole 261.

Figure 11A:
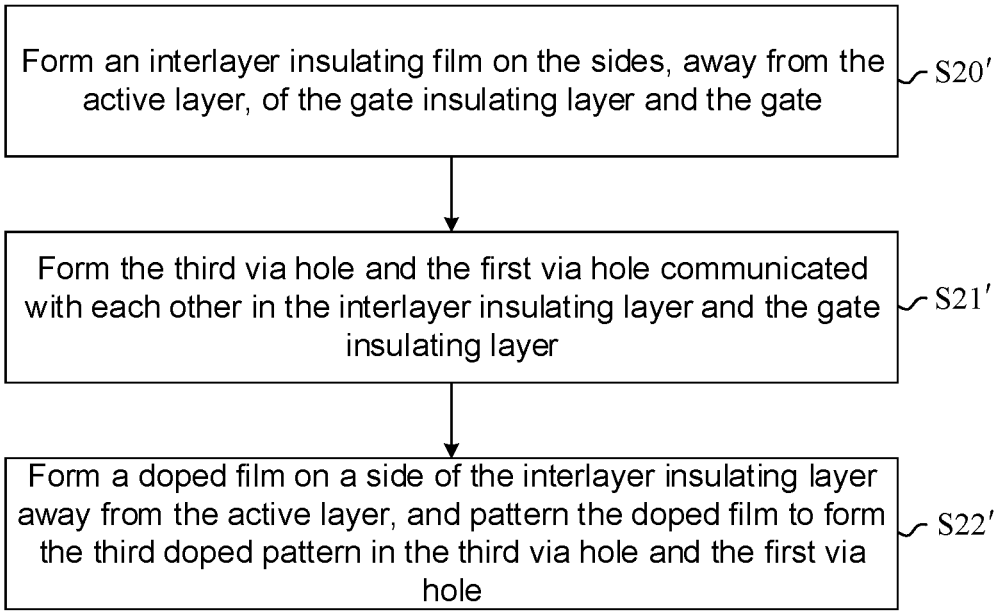
FIG. 11A is a flow diagram of a process of manufacturing another third doped pattern, in accordance with some embodiments of the present disclosure.

In some other embodiments, referring to FIG. 11A, forming the third doped pattern 22 on the side of the active layer 21 may include following steps (S20' to S22').

Figure 11B:
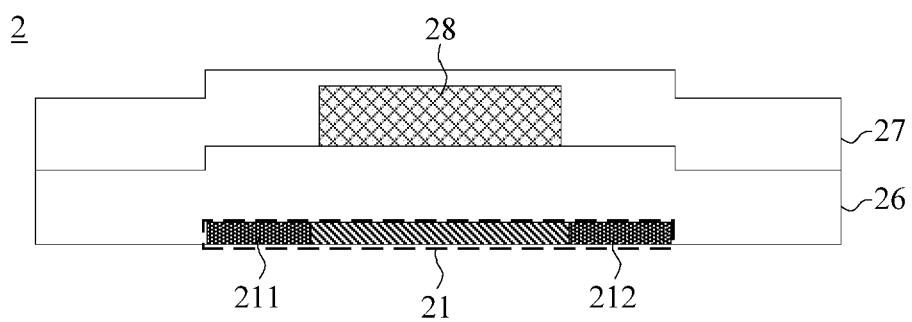
FIGS. 11B to 11E are diagrams of a process of manufacturing another third doped pattern and another fourth doped pattern, in accordance with some embodiments of the present disclosure.

In S20', referring to FIG. 11B, an interlayer insulating film 27 is formed on the sides, away from the active layer 21, of the gate insulating layer 26 and the gate 28.

A thickness of the interlayer insulating layer 27 is, for example, 500 nm.

The interlayer insulating layer 27 may be a single-layer structure, and a material of the single-layer structure is, for example, silicon oxide (SiO); the interlayer insulating layer 27 may also be a laminated structure, such as a double-layer laminated structure, in which a material of one layer proximate to the gate insulating layer 26 is, for example, silicon oxide, and a thickness of the layer is, for example, 200 nm; a material of the other layer is, for example, silicon nitride, and a thickness of the other layer is, for example, 300 nm.

Figure 11C:
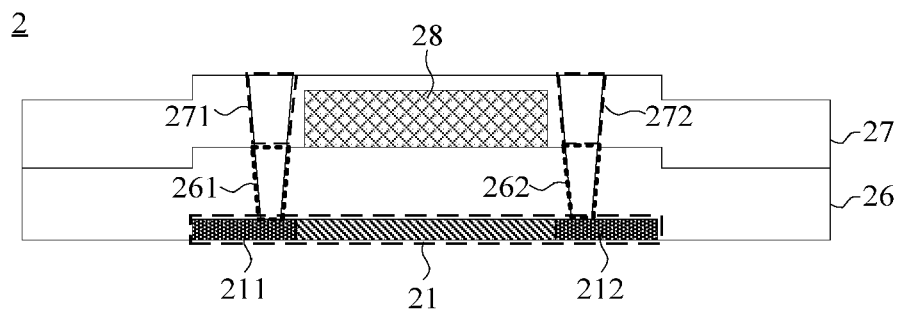

In S21', referring to FIG. 11C, the third via hole 271 and the first via hole 261 communicated with each other are formed in the interlayer insulating layer 27 and the gate insulating layer 26.

The third via hole 271 is located in the interlayer insulating layer 27, the first via hole 261 is located in the gate insulating layer 26, and the orthogonal projection of the third via hole 271 on the active layer 21 and the orthogonal projection of the first via hole 261 on the active layer 21 are located within the range of the first electrode region 211.

For example, the longitudinal sections of the first via hole 261 and the third via hole 271 are both in a shape of an inverted trapezoid.

Figure 11D:
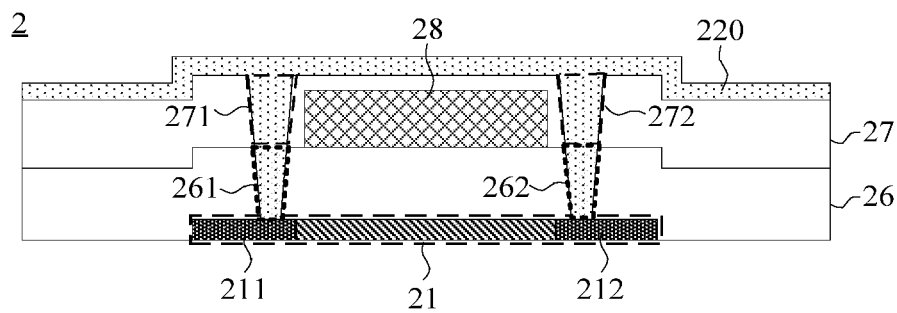

In S22', referring to FIGS. 11D and 7A, the doped film 220 is formed on a side of the interlayer insulating layer 27 away from the active layer 21, and the doped film 220 is patterned to form the third doped pattern 22 in the first via hole 261.

In some embodiments, referring to FIG. 11C, while the third via hole 271 and the first via hole 261 communicated with each other are formed in the interlayer insulating layer 27 and the gate insulating layer 26, the fourth via hole 272 and the second via hole 262 communicated with each other are formed in the interlayer insulating layer 27 and the gate insulating layer 26. The fourth via hole 272 is located in the interlayer insulating layer 27, the second via hole 262 is located in the gate insulating layer 26, and an orthogonal projection of the fourth via hole 272 on the active layer 21 and the orthogonal projection of the second via hole 262 on the active layer 21 are located within the range of the second electrode region 212.

Figure 11E:
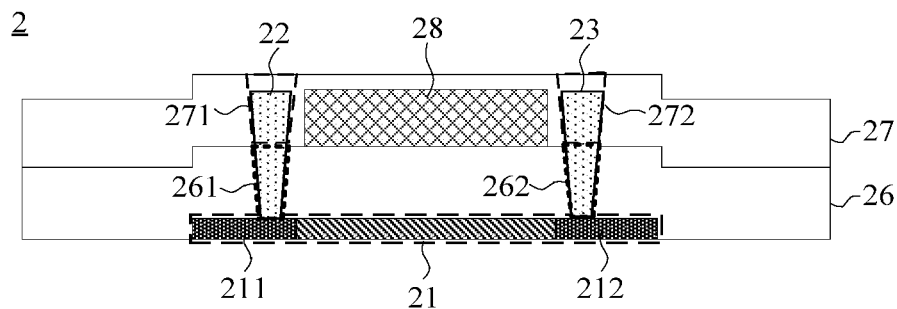

Referring to FIGS. 11D and 11E, the doped film 220 is formed on the side of the interlayer insulating layer 27 away from the active layer 21, and the doped film 220 is patterned, so as to further form the fourth doped pattern 23 in both the fourth via hole 272 and the second via hole 262 while the third doped pattern 22 is formed in both the third via hole 271 and the first via hole 261.

For example, the thickness of the third doped pattern 22 is equal to or approximately equal to the thickness of the fourth doped pattern 23, and is less than a sum of the depths of the first via hole and the third via hole, which facilitates to form a portion of the first electrode 24 in the remaining portion of the third via hole 217, and form a portion of the second electrode 25 in the remaining portion of the fourth via hole 212, subsequently, thereby improving the coupling stability between the first electrode 24 and the third doped pattern 22, and the coupling stability between the second electrode 25 and the fourth doped pattern 23.

In the above embodiments, a material of the doped film 220 is, for example, N+ a-si.

In some embodiments, forming the doped film 220 whose material is N+ a-si includes:
  depositing N+ a-si particles to form the doped film 220;
  or, forming the amorphous silicon film first, then the amorphous silicon film being doped with N+ ions to form the doped film 220.

The amorphous silicon film is doped with N+ ions. For example, it is possible to achieve the purpose of the amorphous silicon film being doped with N+ ions by doping the amorphous silicon film with phosphine (PH3). When the amorphous silicon film is doped, the doping amount of PH3 is, for example, $5 \times 10^{13}/cm^2$ to $1 \times 10^{14}/cm^2$, so as to obtain the lightly doped third doped pattern 22 and the fourth doped pattern 23.

In some embodiments, referring to FIG. 7A, a metal film is deposited on the interlayer insulating layer 27, and the metal thin film is patterned to form the first electrode 24 and the second electrode 25. The first electrode 24 is coupled to the third doped pattern 22, and the second electrode 25 is coupled to the fourth doped pattern 23.

The metal film is, for example, a laminated structure, such as a three-layer laminated structure of a titanium layer, an aluminum layer, and a titanium layer (Ti/Al/Ti), in which the aluminum layer is located in the middle, and a thickness is of the aluminum layer is, for example, 650 nm. A thickness of each Ti layer is, for example, 50 nm.

The method of manufacturing the thin film transistor 2 has the same beneficial effects as the thin film transistor 2 as described above, and details will not be repeated herein.

Figure 12A:
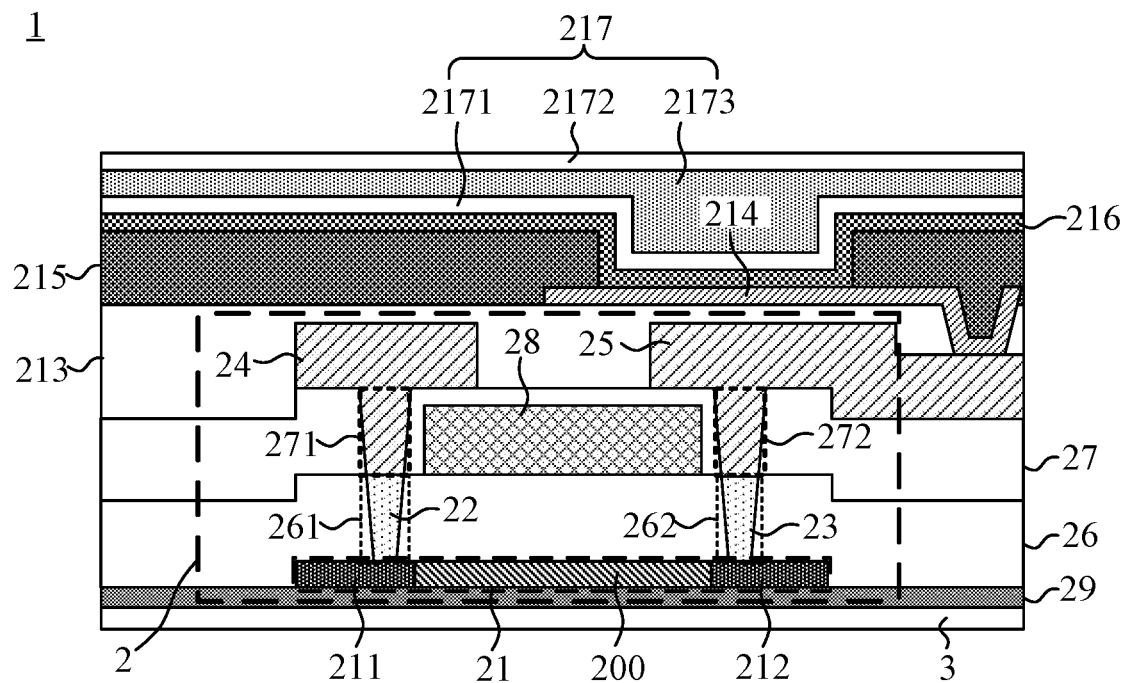
FIG. 12A is a structural diagram of another display apparatus, in accordance with some embodiments of the present disclosure.

Referring to FIG. 12A, in a case where the display apparatus 1 is the OLED display apparatus, after the buffer layer 29 and the thin film transistor 2 are formed on the substrate 3, other film layers such as a planarization layer 213, an anode 214, a pixel defining layer 215, a light-emitting functional layer 216, and an encapsulation layer 217 are formed on sides, away from the active layer 21, of the first electrode 24 and the second electrode 25.

A material of the anode 214 is, for example, indium tin oxide (ITO), and the anode 214 is, for example, coupled to the second electrode 25 of the thin film transistor 2.

A material of the planarization layer 213 is an organic material, such as polyimide (PI).

A material of the pixel defining layer 215 is an organic material, such as photosensitive polyimide.

Figure 12B:
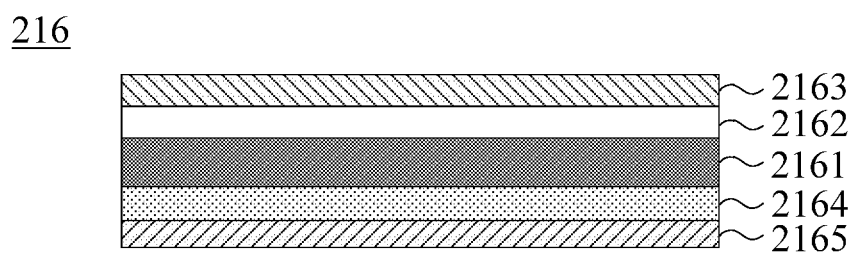
FIG. 12B is a structural diagram of a light-emitting functional layer, in accordance with some embodiments of the present disclosure.

Referring to FIG. 12B, the light-emitting functional layer 216 is used to form the light-emitting device D in the pixel driving circuit 122. In addition to the light-emitting layer 2161, the light-emitting functional layer 216 may further include an electron transporting layer (ETL) 2162, an electron injection layer (EIL) 2163, a hole transporting layer (HTL) 2164 and a hole injection layer (HIL) 2165. It will be noted that, the light-emitting functional layer 216 is not limited to a combination of the light-emitting layer 2161, the ETL 2162, the EIL 2163, the HTL 2164 and the HIL 2165, and may include other functional layers.

The encapsulation layer 217 includes a first inorganic encapsulation sub-layer 2171, an organic encapsulation sub-layer 2173 and a second inorganic encapsulation sub-layer 2172 that are sequentially stacked in the thickness direction of the thin film transistor 2.

A material of the first inorganic encapsulation sub-layer 2171 and the second inorganic encapsulation sub-layer 2172 is, for example, at least one of silicon nitride or silicon oxide. The first inorganic encapsulation sub-layer 2171 and the second inorganic encapsulation sub-layer 2172 may be, formed through a magnetron sputtering process. The organic encapsulation sub-layer 2173 may be formed through an ink jet printing (IJP) process.

The OLED display apparatus has the same beneficial effects as the thin film transistor 2, and details will not be repeated herein.

It will be understood by those skilled in the art that, in the embodiments of the present disclosure, the phrase "approximately equal to", "approximately the same" and "approximately equal" means the same, that is, although two numerical values equal to each other, the difference between the two numerical values is within an allowable error range, so that the influence of the difference can be ignored. For example, the first ion doping concentration is approximately equal to the second ion doping concentration, that is, although the first ion doping concentration and the second ion doping concentration are not the same, the difference between the first ion doping concentration and the second ion doping concentration is within the allowable error range, and the difference does not affect the characteristics of the first electrode region 211 and the second electrode region 212. The allowable error range may be determined according to the characteristics of the actual product, such as ±0.1%, ±1%, which is not limited in the present disclosure.

It will be noted that, in the embodiments of the present disclosure, the first ion doping concentration to the fifth doping concentration all refer to an average value of each doping concentration, and the average value is an arithmetic average value. For example, the third ion doping concentration is the average concentration of doped ions in the third doped pattern 22, however, in the actual third doped pattern 22, the ion doping concentration at each position may have a certain difference. For example, since an ohmic contact needs to be formed between the third doped pattern 22 and the first electrode 24, the ion doping concentration of the portion of the third doped pattern 22 that is in contact with the first electrode 24 may be set to be relatively large, so as to achieve the ohmic contact. In comparison, the ion doping concentration of the remaining portion of the third doped pattern 22 may be set to be relatively small, so as to reduce the drain voltage Vd and leakage current of the thin film transistor.

The foregoing descriptions are merely specific implementations of the present disclosure, but the protection scope of the present disclosure is not limited thereto, any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A thin film transistor, comprising:
an active layer, a material of the active layer being polysilicon, the active layer having a channel region, and a first electrode region and a second electrode region that are located on two opposite sides of the channel region in a direction perpendicular to a thickness direction of the active layer; wherein the first electrode region and the second electrode region are ion doped regions, the first electrode region has a first ion doping concentration, and the second electrode region has a second ion doping concentration;
a first electrode and a second electrode that are disposed on a side of the active layer in the thickness direction of the active layer, the first electrode and the second electrode being arranged in a same layer and made of a same material, wherein the first electrode is coupled to the first electrode region, and the second electrode is coupled to the second electrode region; and
a third doped pattern located above the first electrode region, the third doped pattern being disposed between the first electrode and the active layer in a direction perpendicular to the first electrode region, the third doped pattern being in direct contact with the first electrode and the first electrode region, wherein the third doped pattern has a third ion doping concentration, the first ion doping concentration is greater than the third ion doping concentration, and the third doped pattern includes a semiconductor material.

2. The thin film transistor according to claim 1, further comprising: a fourth doped pattern disposed between the second electrode and the second electrode region, the fourth doped pattern being in direct contact with the second electrode and the second electrode region, wherein the fourth doped pattern has a fourth ion doping concentration, and the fourth ion doping concentration is different from the second ion doping concentration.

3. The thin film transistor according to claim 1, further comprising: a gate insulating layer and a gate that are stacked in the thickness direction of the active layer, the gate insulating layer and the gate being disposed between the active layer and both the first electrode and the second electrode;
wherein the gate insulating layer is located between the active layer and the gate, the gate insulating layer is provided with a first via hole therein, and an orthogonal projection of the first via hole on the active layer is located within a range of an overlapping region between the first electrode region and an orthogonal projection of the first electrode on the active layer; and
the third doped pattern is located in the first via hole.

4. The thin film transistor according to claim 3, further comprising the fourth doped pattern, wherein the gate insulating layer is further provided with a second via hole therein, and an orthogonal projection of the second via hole on the active layer is located within a range of an overlapping region between the second electrode region and an orthogonal projection of second electrode on the active layer; and
the fourth doped pattern is located in the second via hole.

5. The thin film transistor according to claim 4, wherein the fourth doped pattern has a fourth ion doping concentration, and the fourth ion doping concentration is different from the second ion doping concentration; the first ion doping concentration is approximately equal to the second ion doping concentration, the third ion doping concentration is approximately equal to the fourth ion doping concentration.

6. The thin film transistor according to claim 4, wherein a height of the third doped pattern is less than or equal to a depth of the first via hole, and a height of the fourth doped pattern is less than or equal to a depth of the second via hole.

7. The thin film transistor according to claim 4, further comprising an interlayer insulating layer disposed on a side of the gate away from the active layer, the interlayer insulating layer being provided with a third via hole and a fourth via hole therein, wherein the third via hole is communicated with the first via hole, and the fourth via hole is communicated with the second via hole; an orthogonal projection of the third via hole on the active layer is located within the range of the overlapping region between the first electrode region and the orthogonal projection of the first electrode on the active layer, and an orthogonal projection of the fourth via hole on the active layer and an orthogonal projection of the second via hole on the active layer are located within a range of an overlapping region between the second electrode region and the orthogonal projection of the second electrode on the active layer.

8. The thin film transistor according to claim 7, wherein a diameter of the third via hole is greater than a diameter of the first via hole, and a diameter of the fourth via hole is greater than a diameter of the second via hole.

9. The thin film transistor according claim 7, wherein the third doped pattern is further located in the third via hole, and the fourth doped pattern is further located in the fourth via hole.

10. The thin film transistor according to claim 9, wherein a thickness of the third doped pattern is approximately equal to a thickness of the fourth doped pattern.

11. The thin film transistor according to claim 2, wherein a material of the third doped pattern and the fourth doped pattern is a semiconductor material including N+ ions.

12. A display apparatus, comprising the thin film transistor according to claim 1.

13. A manufacturing method for a thin film transistor, comprising:
   forming an active layer, wherein a material of the active layer is polysilicon, the active layer has a channel region, and a first electrode region and a second electrode region that are located on two opposite sides of the channel region in a direction perpendicular to a thickness direction of the active layer, the first electrode region and the second electrode region are ion doped regions, the first electrode region has a first ion doping concentration, and the second electrode region has a second ion doping concentration;
   forming a third doped pattern on a surface of the active layer, wherein the third doped pattern has a third ion doping concentration, and the first ion doping concentration is greater than the third ion doping concentration; and
   forming a first electrode on a surface of the third doped pattern away from the active layer, and forming a second electrode on the active layer, wherein the first electrode and the second electrode are arranged in a same layer and made of a same material, the first electrode is coupled to the first electrode region through the third doped pattern, and the second electrode is coupled to the second electrode region;
   wherein the third doped pattern is located above the first electrode region, the third doped pattern is disposed between the first electrode and the active layer in a direction perpendicular to the first electrode region, and the third doped pattern includes a semiconductor material.

14. The manufacturing method for the thin film transistor according to claim 13, further comprising:
   forming a fourth doped pattern on the surface of the active layer while the third doped pattern is formed on the active layer, wherein the fourth doped pattern is coupled to the second electrode region, the fourth doped pattern has a fourth ion doping concentration, and the fourth ion doping concentration is different from the second ion doping concentration; wherein
   forming the second electrode on the active layer includes:
      forming the second electrode on a surface of the fourth doped pattern away from the active layer; wherein the fourth doped pattern is coupled to the second electrode.

15. The manufacturing method for the thin film transistor according to claim 13, wherein forming the active layer includes:
   forming a polysilicon film to form a semiconductor pattern through a patterning process;
   forming a gate insulating layer on a side of the semiconductor pattern;
   forming a gate on a side of the gate insulating layer away from the semiconductor pattern; and
   performing ion doping on portions of the semiconductor pattern where the first electrode region and the second electrode region are to be formed to form the active layer.

16. The manufacturing method for the thin film transistor according to claim 15, wherein
   forming the third doped pattern on the surface of the active layer includes:
      forming a first via hole in the gate insulating layer, an orthogonal projection of the first via hole on the active layer being located within a range of the first electrode region; and
   forming a doped film on sides, away from the active layer, of the gate insulating layer and the gate; and
   patterning the doped film to form the third doping patter in the first via hole.

17. The manufacturing method for the thin film transistor according to claim 16, further comprising:
   forming a second via hole while the first via hole is formed on the gate insulating layer, an orthogonal projection of the second via hole on the active layer being located within a range of the second electrode region; wherein
   the doped film is formed on the sides, away from the active layer, of the gate insulating layer and the gate, and the doped film is patterned, so as to form the fourth doped pattern in the second via hole while the third doped pattern is formed in the first via hole.

18. The manufacturing method for the thin film transistor according to claim 15, wherein
   forming the third doped pattern on the surface of the active layer includes:
   forming an interlayer insulating layer on sides, away from the active layer, of the gate insulating layer and the gate;
   forming a third via hole and a first via hole communicated with each other in the interlayer insulating layer and the gate insulating layer; wherein the third via hole is located in the interlayer insulating layer, and the first via hole is located in the gate insulating layer, an orthogonal projection of the third via hole on the active layer and an orthogonal projection of the first via hole on the active layer are located within a range of the first electrode region; and
   forming a doped film on a side of the interlayer insulating layer away from the active layer; and
   patterning the doped film to form the third doped pattern in both the third via hole and the first via hole.

19. The manufacturing method for the thin film transistor according to claim 18, further comprising:
   while the third via hole and the first via hole communicated with each other are formed on the interlayer insulating layer and the gate insulating layer, forming a fourth via hole and a second via hole communicated with each other in the interlayer insulating layer and the gate insulating layer, wherein the fourth via hole is located in the interlayer insulating layer, the second via hole is located in the gate insulating layer, and an orthogonal projection of the fourth via hole on the active layer and an orthogonal projection of the second via hole on the active layer are located within a range of the second electrode region; wherein
   the doped film is formed on the side of the interlayer insulating layer away from the active layer, and the doped film is patterned, so as to form the fourth doped pattern in both the fourth via hole and the second via hole while the third doped pattern is formed in the third via hole and first via hole.

20. The thin film transistor according to claim 6, wherein a thickness of the third doped pattern is approximately equal to a thickness of the fourth doped pattern.

* * * * *